US011622486B2

(12) United States Patent
Otawara et al.

(10) Patent No.: US 11,622,486 B2
(45) Date of Patent: Apr. 4, 2023

(54) MOTOR AND MOTOR MANUFACTURING METHOD

(71) Applicant: DENSO CORPORATION, Kariya (JP)

(72) Inventors: Akihiro Otawara, Kariya (JP); Yuki Fujita, Kariya (JP); Yosuke Kanbe, Kariya (JP); Kenji Kani, Kariya (JP); Hiroyuki Okada, Kariya (JP); Yoshiaki Fukuta, Kariya (JP)

(73) Assignee: DENSO CORPORATION, Kariya (JP)

( * ) Notice: Subject to any disclaimer, the term of this patent is extended or adjusted under 35 U.S.C. 154(b) by 579 days.

(21) Appl. No.: 16/625,263

(22) PCT Filed: Jun. 28, 2018

(86) PCT No.: PCT/JP2018/024554
§ 371 (c)(1),
(2) Date: Dec. 20, 2019

(87) PCT Pub. No.: WO2019/004348
PCT Pub. Date: Jan. 3, 2019

(65) Prior Publication Data
US 2020/0154618 A1   May 14, 2020

(30) Foreign Application Priority Data

Jun. 29, 2017 (JP) .............................. JP2017-127648
Mar. 27, 2018 (JP) .............................. JP2018-060409

(51) Int. Cl.
*H02K 15/00* (2006.01)
*H02K 5/04* (2006.01)
(Continued)

(52) U.S. Cl.
CPC ............. *H05K 13/046* (2013.01); *H02K 5/04* (2013.01); *H02K 11/38* (2016.01);
(Continued)

(58) Field of Classification Search
CPC ................................ H02K 11/00; H02K 7/116
(Continued)

(56) References Cited

U.S. PATENT DOCUMENTS 9,025,319 B2    5/2015  Schweichart et al.
2005/0082265 A1 4/2005  Yamabuki et al.
(Continued)

FOREIGN PATENT DOCUMENTS

CN    1642714 A    7/2005
CN    102457137 A   5/2012
(Continued)

OTHER PUBLICATIONS

Sep. 18, 2018 International Search Report issued in International Patent Application No. PCT/JP2018/024554.

*Primary Examiner* — Jose A Gonzalez Quinones
(74) *Attorney, Agent, or Firm* — Oliff PLC

(57) ABSTRACT

A motor includes: a rotating shaft; a motor portion; a circuit board; a case having a circuit housing recess portion for housing the circuit board; and a cover made of a synthetic resin and sealing the opening portion of the circuit housing recess portion. The cover has an outer circumference rib and an inside rib. The outer circumference rib is located on the outer circumferential side from the opening end surface of the circuit housing recess portion and projects from the outer circumferential edge of the cover toward the front surface side of the cover and the rear surface side of the cover. The inside rib is located inside from the opening end surface and projects at least either on the front surface side of the cover or on the rear surface side of the cover.

8 Claims, 15 Drawing Sheets

(51) Int. Cl.
    *H02K 11/38*     (2016.01)
    *H02K 7/116*     (2006.01)
    *H05K 13/04*     (2006.01)
    *H02K 15/14*     (2006.01)
    *H05K 3/30*     (2006.01)

(52) U.S. Cl.
    CPC ......... *H02K 15/0068* (2013.01); *H02K 15/14* (2013.01); *H05K 3/303* (2013.01)

(58) Field of Classification Search
    USPC ....................................... 310/68 R, 75 R, 98
    See application file for complete search history.

(56) References Cited

U.S. PATENT DOCUMENTS

| | | |
|---|---|---|
| 2012/0112579 A1 | 5/2012 | Kokubu |
| 2019/0252952 A1 | 8/2019 | Otawara et al. |

FOREIGN PATENT DOCUMENTS

| | | | | |
|---|---|---|---|---|
| CN | 203933241 U | 11/2014 | | |
| DE | 102012213234 A1 * | 1/2014 | ............. | H02K 11/38 |
| JP | 2003-47194 A | 2/2003 | | |
| JP | 2011189868 A * | 9/2011 | | |
| JP | 2016000555 A * | 1/2016 | | |
| JP | 2016-149877 A | 8/2016 | | |
| WO | 2014/016093 A2 | 1/2014 | | |

\* cited by examiner

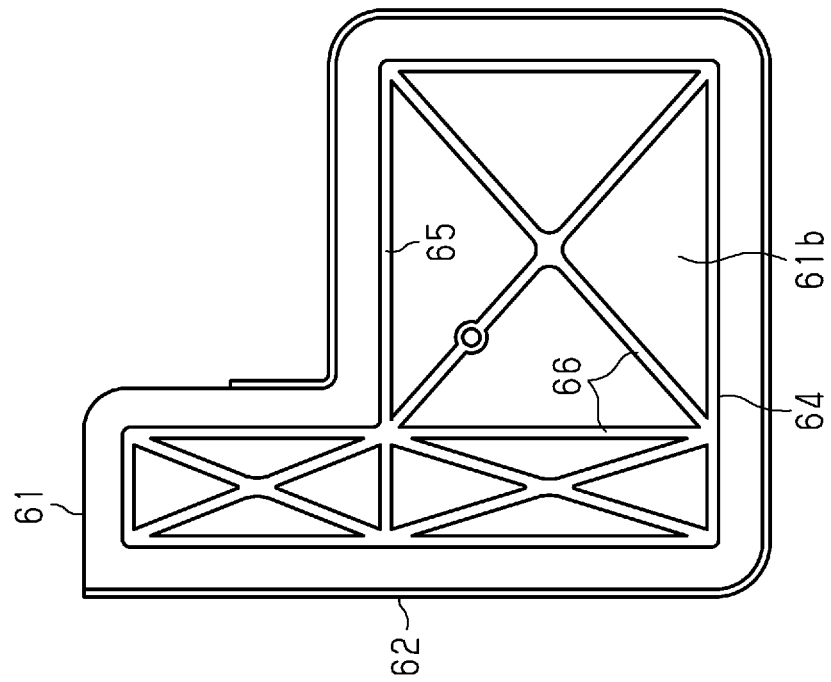
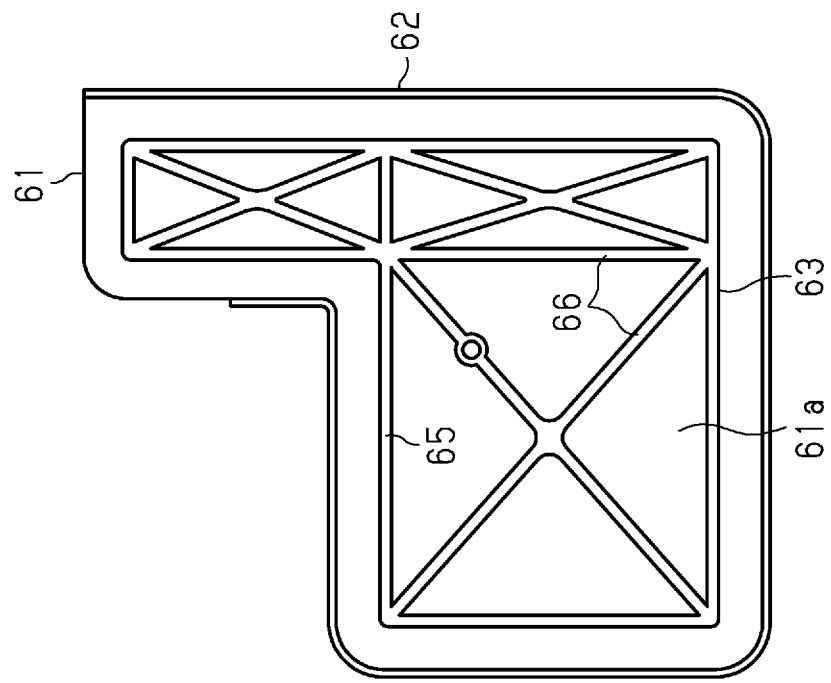

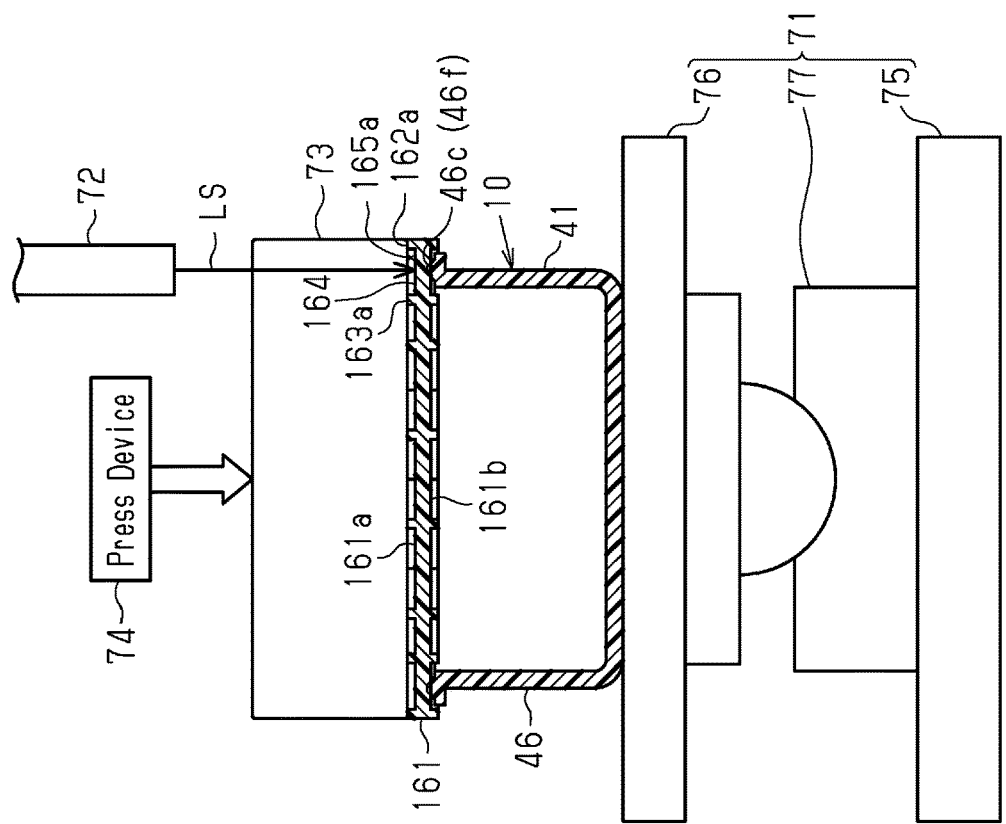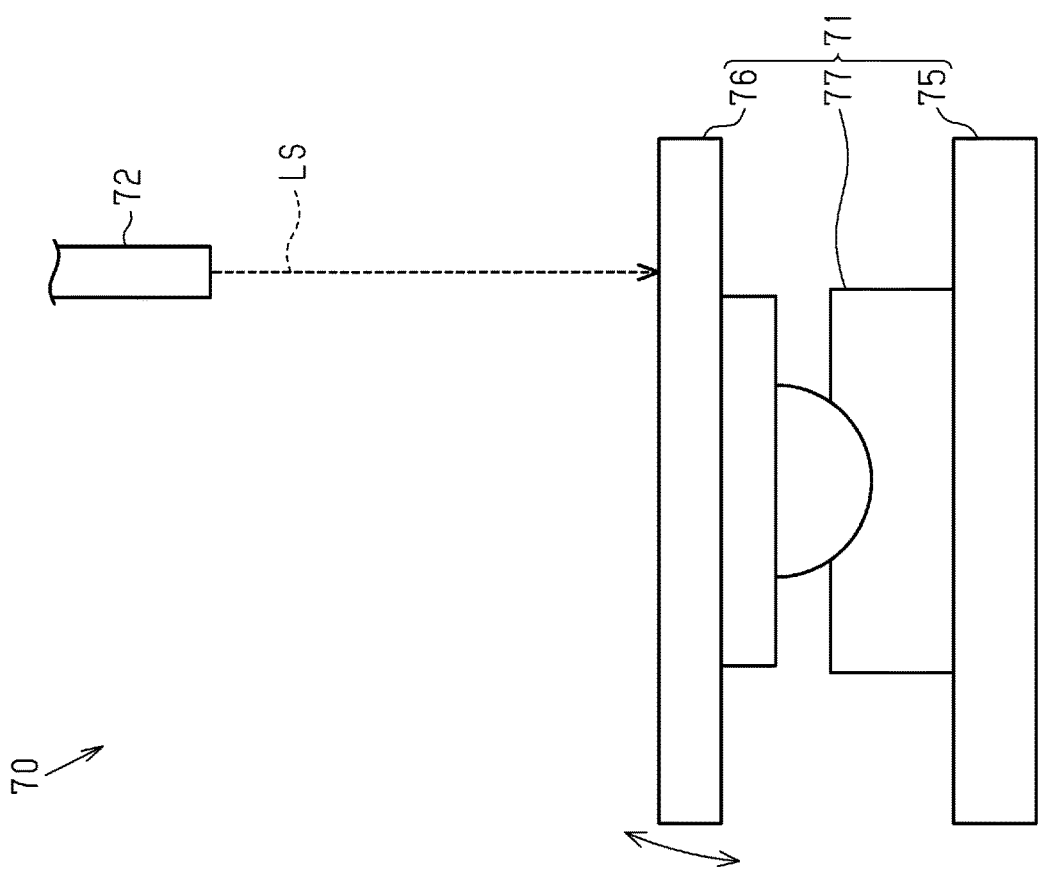

MOTOR AND MOTOR MANUFACTURING METHOD

CROSS-REFERENCE TO RELATED APPLICATIONS

The present application is based on Japanese Patent Application No. 2017-127648 filed on Jun. 29, 2017 and Japanese Patent Application No. 2018-060409 filed on Mar. 27, 2018, the entire contents of which are incorporated by reference herein.

TECHNICAL FIELD

The present disclosure relates to a motor and a motor manufacturing method.

BACKGROUND ART

A typical motor includes a motor unit that rotates a rotary shaft, a circuit board that controls rotation of the rotary shaft, a case that includes a circuit accommodating recess accommodating the circuit board, and a flat cover that is made of a synthetic resin material and closes an opening of the circuit accommodating recess (refer to Patent Document 1). A peripheral edge of the cover is fixed to an open end of the circuit accommodating recess in the case through welding or the like.

PRIOR ART DOCUMENT

Patent Document

Patent Document 1 U.S. Pat. No. 9,025,319

SUMMARY OF THE INVENTION

In order to reduce the material cost of the cover, the thickness of the cover is decreased to reduce the amount of resin used for the cover. However, if the thickness of the cover is merely decreased, the cover may warp and not be able to fully contact the open end of the circuit accommodating recess. In this case, when the cover closes the opening of the circuit accommodating recess, a gap may be formed between the open end of the circuit accommodating recess and the cover. Thus, the cover will not fully contact the open end of the circuit accommodating recess. As a result, it will be difficult to fix the open end of the circuit accommodating recess and the cover so that the periphery of the opening of the circuit accommodating recess is entirely liquid-tight. This will adversely affect the liquid tightness between the open end of the circuit accommodating recess and the covet A motor used as, for example, a drive source of a power window device that electrically raises and lowers a window glass of a vehicle is located in the vehicle that is easily wet. Thus, it is desirable that the open end of the circuit accommodating recess and the be liquid-tight so that the circuit board is not affected by liquid such as water.

A first object of the present disclosure is to provide a motor that improves the seal between an open end of a circuit accommodating recess and a cover even if the cover has a decreased thickness.

Further, if the motor is located at a position where the motor may be wet, there is a need for a structure that fixes the peripheral edge of the cover to the open end of the circuit accommodating recess in a liquid-tight manner to ensure prevention of the entrance of water immersion into the circuit accommodating recess accommodating the circuit board. One method for fixing the cover to the case is laser welding. Preferably, welding is performed in a state in which the degree of seal is high between the cover and the case to fix the cover to the case in a highly liquid-tight manner. The inventors of the present invention use a method that arranges, for example, a glass jig as a transparent jig on a front surface of the cover (opposite side of case) and transmits a laser beam through the glass jig, which is a transparent body, while pressing the cover ward the case through the glass jig to irradiate the portion of the cover welded to the case with the laser beam.

If foreign material is present in an optical path of the laser beam, however, the laser beam may heat the foreign material and cause the temperature of the portion of the glass jig proximate to the foreign material to be abnormally high. This may crack or fracture the glass jig. If the transparency of the glass jig is reduced by such a crack or fracture, transmission of the laser beam will be hindered and result in insufficient welding of the cover and the case. Further, replacement of the glass jig to prevent insufficient welding will lead to an increase in the production cost of the motor.

A second object of the present disclosure is to provide a motor and a motor manufacturing method having a structure that allows the cover and the case to be stably fixed over a long period.

A motor according to a first aspect of the present disclosure includes a rotary shaft, a motor unit that rotates the rotary shaft, a circuit board that controls rotation of the rotary shaft, a case including a circuit accommodating recess that accommodates the circuit board, and a synthetic resin cover that closes an opening of the circuit accommodating recess. The cover includes an outer rib and an inner rib. The outer rib is located outward from an open end surface of the circuit accommodating recess and projected from a peripheral edge of the cover toward a side of a front surface and a side of a rear surface of the cover. The inner rib is located inward from the open end surface and projected toward at least one of the side of the front surface of the cover or the side of the rear surface of the cover.

According to this structure, the cover includes the outer rib, which is located outward from the open end surface of the circuit accommodating recess, and the inner rib, which is located inward from the open end surface. Thus, the outer rib and the inner rib restrict warping of the cover, which is made of synthetic resin. The cover is fixed to the open end of the circuit accommodating recess at the portion inward from the outer rib and outward from the inner rib. This improves the seal between the open end of the circuit accommodating recess and the cover even if the cover has a decreased thickness.

A motor according to a second aspect of the present disclosure includes a case including a circuit accommodating recess, a circuit board accommodated in the circuit accommodating recess, and a substantially flat cover that closes an opening of the circuit accommodating recess. The cover and an open end of the circuit accommodating recess are laser-welded and fixed to each other. The cover includes a fixing portion laser-welded and fixed to the open end of the circuit accommodating recess. The fixing portion is located in a recess relatively recessed from two sides of the fixing portion.

According to this aspect, the fixing portion of the cover, which is laser-welded and fixed to the open end of the circuit accommodating recess, is located in the recess relatively recessed from two sides of the fixing portion. Thus, laser welding is performed in a preferred manner by pressing the cover relatively toward the circuit accommodating recess with the glass jig, which serves as a transparent jig, and transmitting a laser beam through the glass jig to irradiate the fixing portion of the cover. Specifically, the glass jig and the fixing portion of the cover are spaced apart by the recess in the optical path of the laser beam so that burnt foreign material that may be generated during laser welding is prevented from collecting in the glass jig. The collection of foreign material in the glass jig may lead to abnormally high temperatures in the proximity of foreign material that would be collected on the glass jig in subsequent irradiation of foreign material with laser beam, which may generate cracks and fractures that may lead to deterioration of transparency of the glass jig. Thus, it is significant that burnt foreign material does not collect on the glass jig. Accordingly, the transmission of the laser beam through the glass jig can be maintained in a preferred manner, and the welding of the cover can be stably performed for a long period.

BRIEF DESCRIPTION OF THE DRAWINGS

The above objects, other objects, features, and advantages of the present disclosure will become clearer in the detailed description below with reference to the accompanied drawings.

FIG. 7A is a front view of a cover shown in FIG. 1.

FIG. 7B is a rear view of the cover shown in FIG. 1.

FIG. 15A is a schematic configuration diagram of a welding device by which the cover shown in FIG. 9 is welded.

FIG. 15B is a schematic configuration diagram of the welding device by which the cover shown in FIG. 9 is welded.

MODES FOR CARRYING OUT THE INVENTION

A motor according to a first embodiment will now be described.

Figure 1:
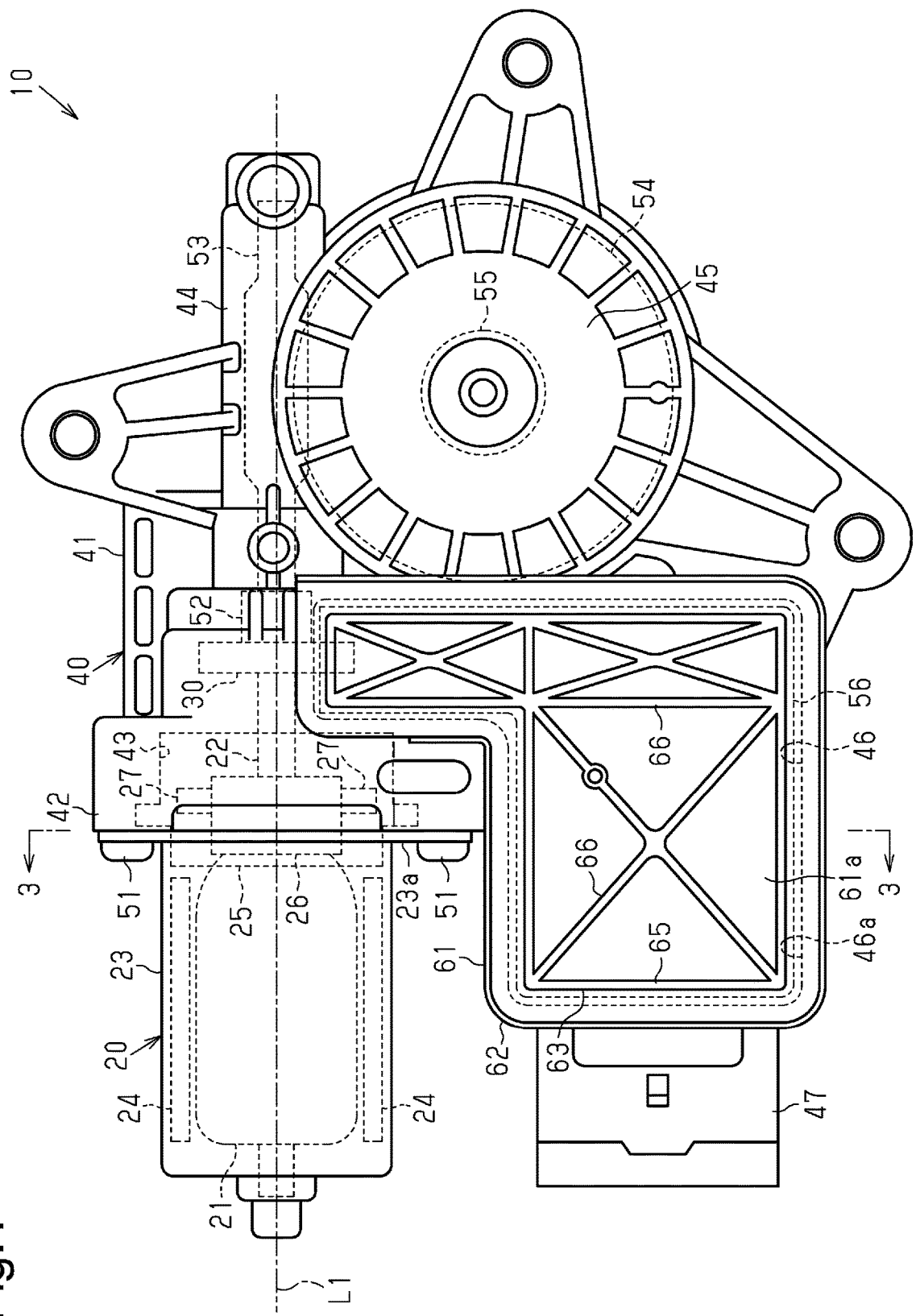
FIG. 1 is a front view of a motor according to a first embodiment.

As shown in FIG. 1, a motor 10 according to the present embodiment is a geared motor including a control circuit and is used as a drive source of a power window device that electrically raises and lowers a window glass of a vehicle. The motor 10 includes a motor unit 20 that rotates a rotary shaft 22 of a rotor 21 and an output unit 40 that reduces the speed of the rotation of the rotary shaft 22 and outputs the rotation.

The motor unit 20 includes a yoke housing 23 having a closed end. The yoke housing 23 is made of a conductive metal material and includes a permanent magnet 24 fixed to an inner peripheral surface of the yoke housing 23. A flange 23a extends outward from the opening of the yoke housing 23.

Figure 2:
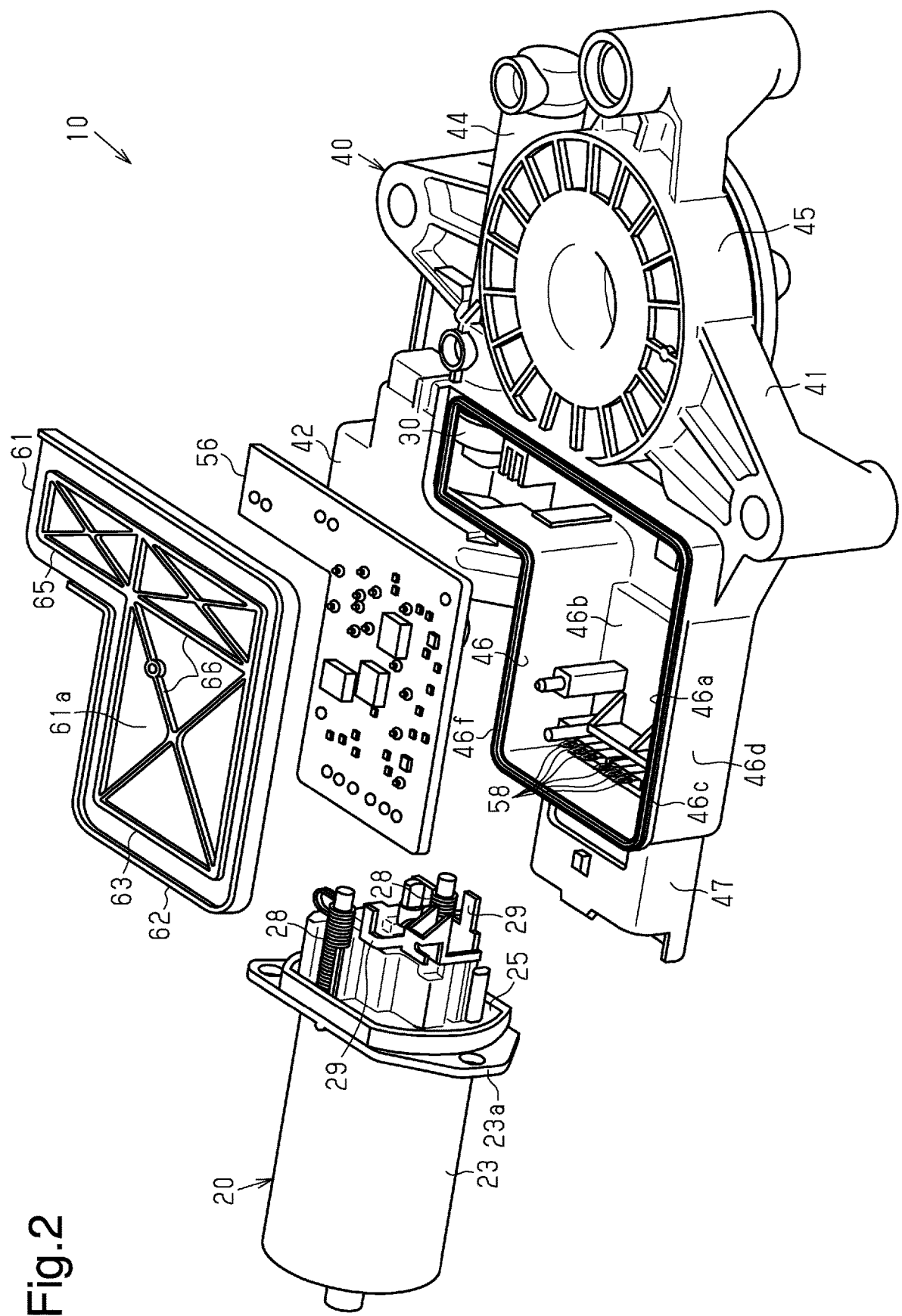
FIG. 2 is an exploded perspective view of the motor shown in FIG. 1.

As shown in FIGS. 1 and 2, the motor unit 20 includes a brush holder 25 arranged to substantially close the opening of the yoke housing 23. The brush holder 25 holds two power brushes 27 that slide in contact with a commutator 26 of the rotor 21. The brush holder 25 holds terminals 29, which are electrically connected to the power brushes 27 by choke coils 28. The rotary shaft 22 extends through the brush holder 25 in the axial direction, and an annular sensor magnet 30 is fixed to a portion of the rotary shaft 22 that is located at a distal side projecting outward (toward output unit 40) from the brush holder 25 so as to be rotatable integrally with the rotary shaft 22.

The output unit 40 includes a gear housing 41, which serves as a case and is made of a synthetic resin material. The gear housing 41 includes a fixed portion 42 to which the flange 23a of the yoke housing 23 is fixed. The yoke housing 23 and the gear housing 41 are connected to each other by fixing the flange 23a to the fixed portion 42 with bolts 51 in a state in which the brush holder 25 is held between the yoke housing 23 and the gear housing 41.

The gear housing 41 includes a brush holder accommodating recess 43 inside the fixed portion 42 to accommodate part of the brush holder 25 (portion exposed out of yoke housing 23). Further, the gear housing 41 includes a worm accommodating portion 44 extending from the fixed portion 42 in the direction of rotation axis L1 of the rotary shaft 22 and a wheel accommodating portion 45 arranged sideward (downward in FIG. 1) from the worm accommodating portion 44. The worm accommodating portion 44 accommodates a worm shaft 53 connected to a distal end of the rotary shaft 22 by a clutch 52, and the wheel accommodating portion 45 accommodates a worm wheel 54 meshed with the worm shaft 53. An output shaft 55 is arranged along the axis of the worm wheel 54. A distal end (end located downward from plane of FIG. 1) of the output shaft 55 is exposed out of the gear housing 41, and rotation of the rotary shaft 22, which is reduced in speed by the worm shaft 53 and the worm wheel 54, is output from the output shaft 55. The distal end of the output shaft 55 is connected to a window glass by a regulator or the like (not shown).

The motor 10 of the present embodiment has a flat shape in a transverse direction and a longitudinal direction as viewed in the direction of rotation axis L1. In the present embodiment, when viewed in the direction of rotation axis L1, the rotation axis direction of the output shaft 55 is the transverse direction (thickness direction) of the motor 10, and the direction orthogonal to the rotation axis of the output shaft 55 is the longitudinal direction of the motor 10. That is, in the present embodiment, when viewed in the direction of rotation axis L1, the direction orthogonal to the rotation axis of the output shaft 55 is a motor flat direction, and the rotation axis direction of the output shaft 55 is a motor flat orthogonal direction.

The gear housing 41 includes a circuit accommodating recess 46 extending in the motor flat orthogonal direction (direction perpendicular to FIG. 1). In other words, the circuit accommodating recess 46 extends in the thickness direction of the motor 10, which is the rotation axis direction of the worm wheel 54 (output shaft 55). The circuit accommodating recess 46 is arranged in a portion of the gear housing 41, which projects from the wheel accommodating portion 45 toward the motor unit 20 (leftward in FIG. 1). An opening 46a of the circuit accommodating recess 46 is directed in the motor flat orthogonal direction, which is the same as the direction which the circuit accommodating recess 46 extends. The circuit accommodating recess 46 of the present embodiment is substantially L-shaped as viewed in the motor flat orthogonal direction (i.e., form shown in FIG. 1). The circuit accommodating recess 46 accommodates the circuit board 56 shaped in accordance with the opening 46a of the circuit accommodating recess 46.

The circuit board 56 is substantially L-shaped in accordance with the opening 46a of the circuit accommodating recess 46. The circuit board 56 includes a Hall IC 57 (refer to FIG. 3) serving as a magnetic sensor that detects a magnetic field of the sensor magnet 30 and an entrapment prevention controller having various elements to perform control to prevent entrapment caused by the window glass. The circuit board 56 is electrically connected to the terminals 29 held by the brush holder 25. Connector terminals 58 extending from a connector 47, which is arranged beside the circuit accommodating recess 46 of the gear housing 41, are exposed to the inside of the circuit accommodating recess 46. The connector terminals 58 are electrically connected to the circuit board 56. An external connector (not shown) is connected to the connector 47 to supply the circuit board 56 with power from an external power supply device and transfer signals for controlling rotation of the rotary shaft 22 with an external device.

Figure 3:
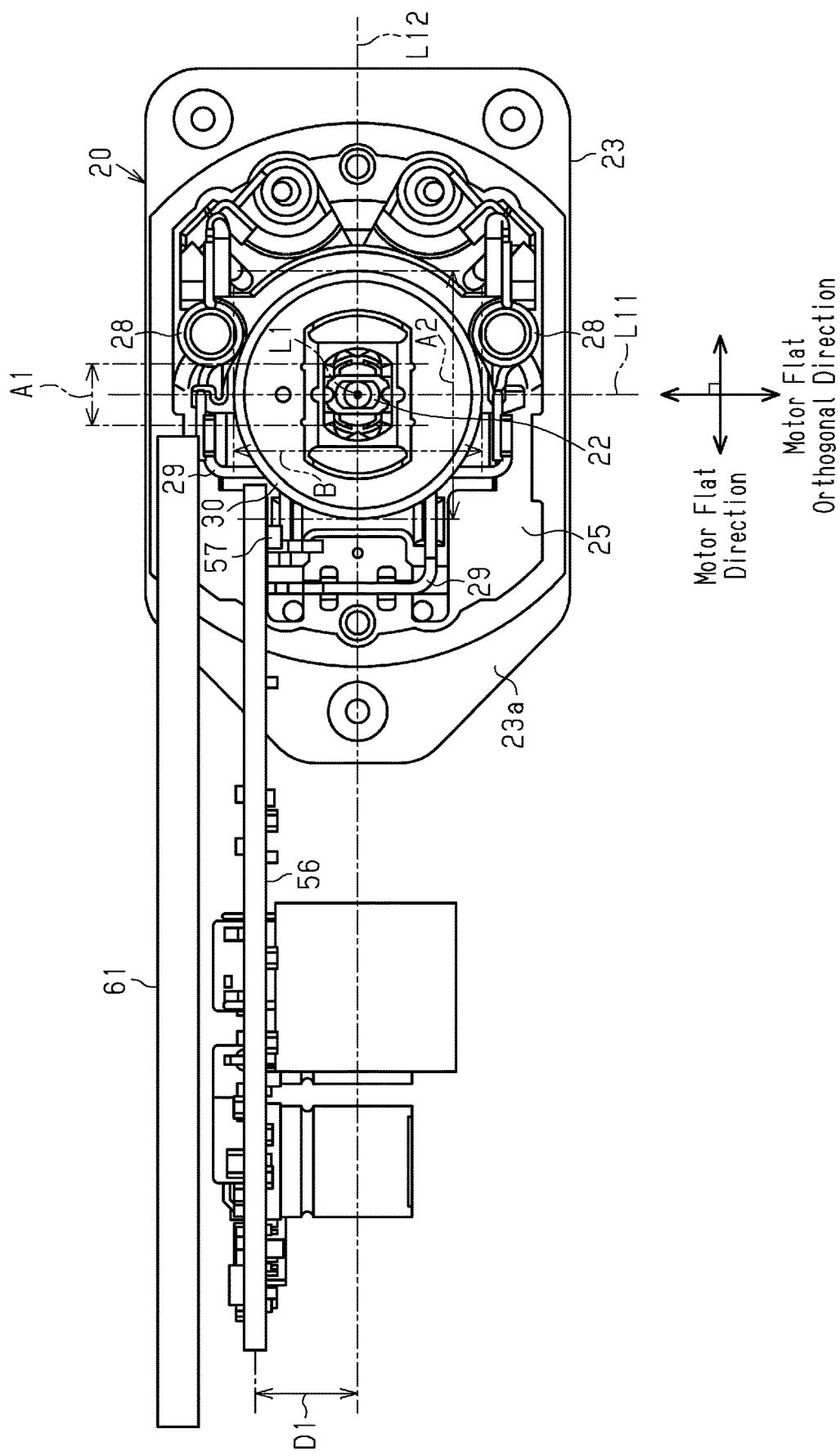
FIG. 3 is a side view of a motor unit, a circuit board, and a cover of the motor shown in FIG. 1.

As shown in FIGS. 2 and 3, the circuit board 56 is accommodated in the circuit accommodating recess 46 in parallel with a bottom 46b of the circuit accommodating recess 46. The circuit board 56 is arranged so that the thickness direction (vertical direction in FIG. 3) of the circuit hoard 56 is parallel to the motor flat orthogonal direction as viewed in the direction of rotation axis L1.

As shown in FIG. 3, the Hall IC 57 of the circuit board 56 is configured to simultaneously detect an upright magnetic field, which enters the Hall IC 57 in the vertical direction, and a transverse magnetic field, which enters the Hall IC 57 in the horizontal direction, in the present embodiment. In the present embodiment, the Hall IC 57 is located outside a motor flat direction range A1 of the rotary shaft 22 and a motor flat direction range A2 of the sensor magnet 30 as viewed in the direction of rotation axis L1. In the present embodiment, the Hall IC 57 is located in the motor flat orthogonal direction range B of the sensor magnet 30 as viewed in the direction of rotation axis L1. Specifically, when viewed in the direction of rotation axis L1, the Hall IC 57 is located at an angular position (upper left position from rotary shaft 22 in FIG. 3) between line L11, which extends in the motor flat orthogonal direction through rotation axis L1, and line L12, which extends in the motor flat direction through rotation axis L1. The Hall IC 57, which is configured to simultaneously detect the upright magnetic field and the transverse magnetic field is used and located in such a position so that the circuit hoard 56 does not necessarily have to be extended in the motor flat direction to a position that overlaps line L11 as viewed in the direction of rotation axis L1. Thus, the circuit board 56 is reduced in size in the motor flat direction so that the circuit board 56 is located at a position that does not overlap the rotary shaft 22 in the motor flat orthogonal direction as viewed in the direction of rotation axis L1.

Figure 4:
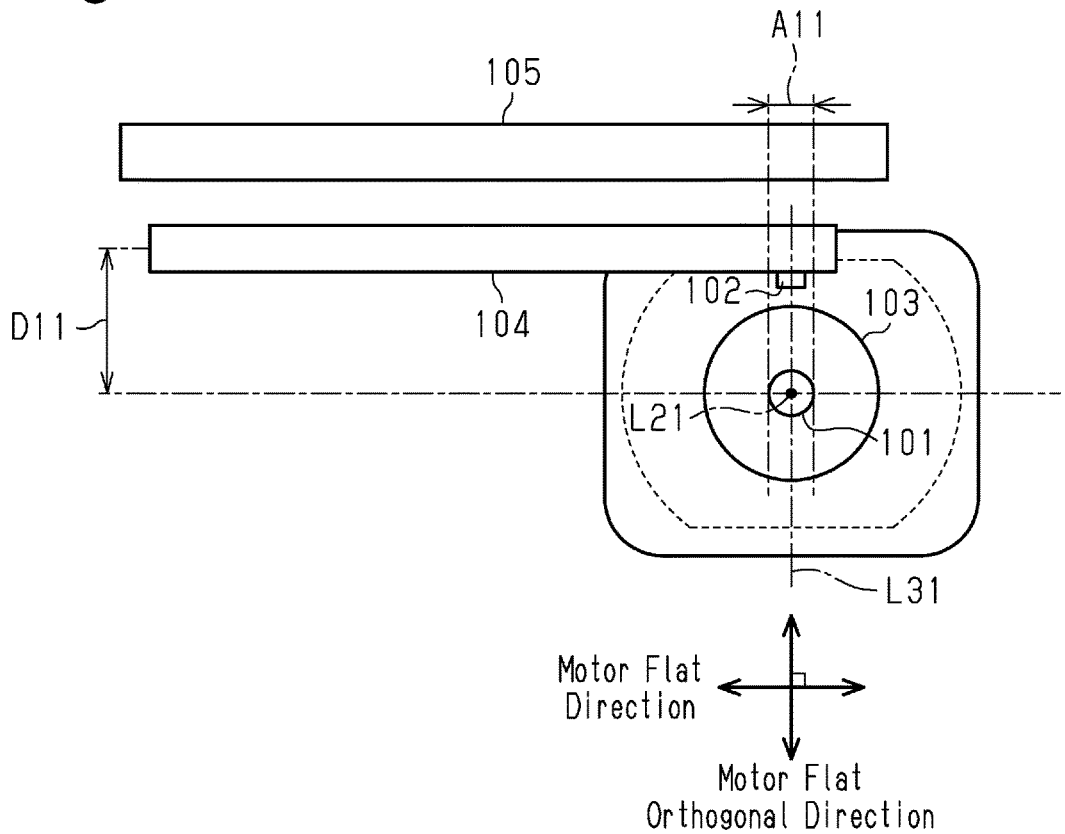
FIG. 4 is a schematic view showing part of a conventional motor.

FIG. 4 is a schematic view of a motor in which a Hall IC 102 is located at a position opposed to a sensor magnet 103 in the diameter direction of the sensor magnet 103 within motor flat direction range A11 of the rotary shaft 101 as viewed in rotation axis L21 direction of the rotary shaft 101. In the motor shown in FIG. 4, a circuit board 104 is extended in the motor flat direction to a position that overlaps line L31, which extends in the motor flat orthogonal direction through rotation axis L21 as viewed in rotation axis L21 direction. Thus, the opening of the circuit accommodating recess (not shown) that accommodates the circuit board 104 is extended to a range that overlaps the rotary shaft 101 in the motor flat orthogonal direction in accordance with the size of the circuit board 104. In other words, a cover 105 that closes the opening of the circuit accommodating recess is extended to a position that overlaps the rotary shaft 101 in the motor flat orthogonal direction in accordance with the size of the opening. In the motor shown in FIG. 4, the distance between rotation axis L21 and the circuit board 104 as viewed in rotation axis L21 direction is referred to as distance D11.

As shown in FIGS. 1 and 3, in the present embodiment, the Hall IC 57 is located at the position described above so that the circuit board 56 is located at a position that does not overlap line L11 but overlaps the sensor magnet 30 in the motor flat direction (right-left direction in FIG. 3) as viewed in the direction of rotation axis L1. Thus, distance D1 between rotation axis LI and the circuit board 56 (i.e., distance between line L12 and circuit board 56) as viewed in the direction of rotation axis L1 is more reduced than that of the motor shown in FIG. 4. Distance D1 is shorter than distance D11 (refer to FIG. 4).

As shown in FIG. 1, the opening 46a of the circuit accommodating recess 46 is shaped in accordance with the shape of the circuit board 56 so that the circuit board 56 can be located inside the circuit accommodating recess 46 from the opening 46a. When the circuit board 56 is reduced in size, the opening 46a of the circuit accommodating recess 46 can also be reduced in accordance with the size of the circuit board 56. In the present embodiment, the opening 46a of the circuit accommodating recess 46 is formed in a range that does not overlap the rotary shaft 22 as viewed in the motor flat orthogonal direction (state shown in FIG. 1) in accordance with the size of the circuit board 56.

Figure 6:
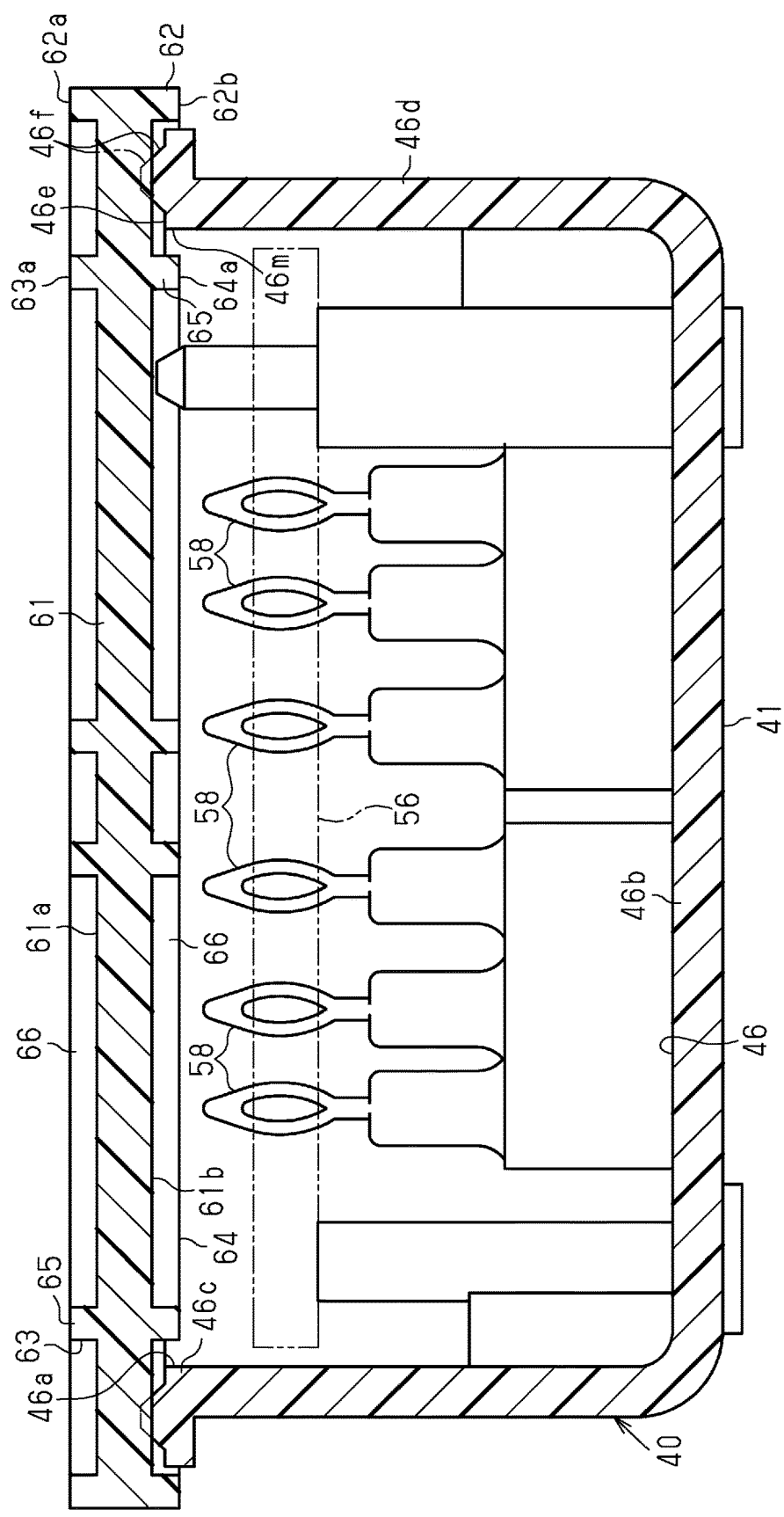
FIG. 6 is a cross-sectional view of the motor taken along line 3-3 in FIG. 1.

As shown in FIGS. 1 and 6, the opening 46a of the circuit accommodating recess 46 is closed by a cover 61 made of synthetic resin. The cover 61 is shaped in accordance with the shape of the opening 46a of the circuit accommodating recess 46 and is sized not to overlap the rotary shaft 22 in the motor flat orthogonal direction. The cover 61 is a flat and substantially L-shaped in accordance with the shape of the opening 46a of the circuit accommodating recess 46.

Figure 5:
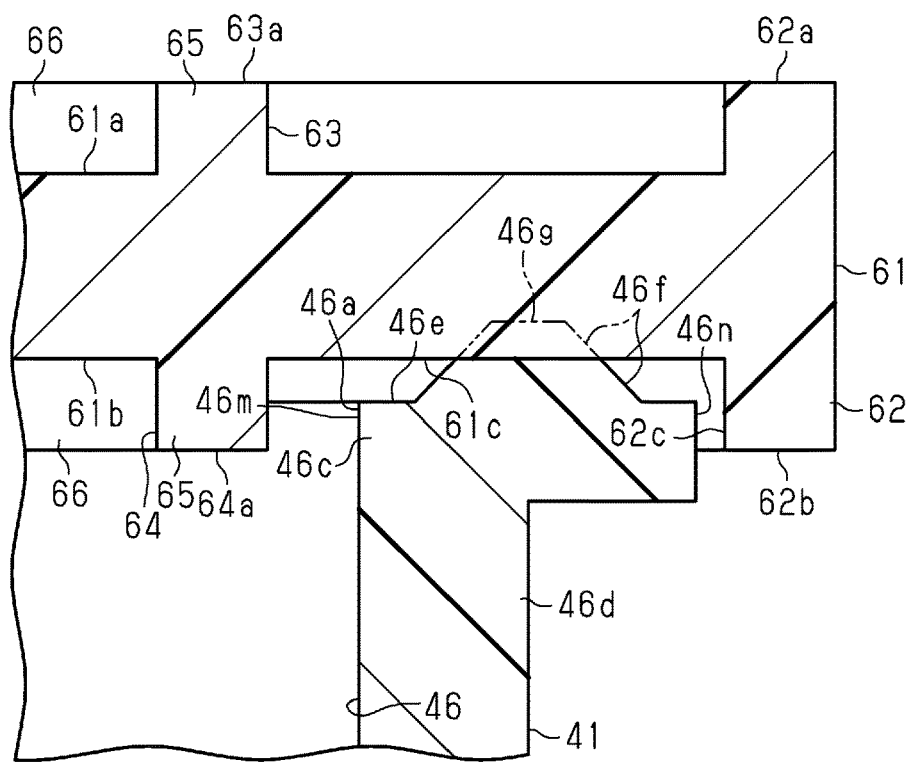
FIG. 5 is a cross-sectional view of the motor shown in FIG. 1.

As shown in FIGS. 5 and 6, the cover 61 is fixed, by laser welding, to the open end 46c of the circuit accommodating recess 46. The open end 46c of the circuit accommodating recess 46 according to the present embodiment is a distal end of a side wall 46d extending from a peripheral edge of the circuit accommodating recess 46. An open end surface 46e (distal end surface of side wall 46d) of the circuit accommodating recess 46 is flat. The open end surface 46e includes a looped projection 46f extending along the open end 46c of the circuit accommodating recess 46. The projection 46f projects from the open end surface 46e in a direction in which the circuit accommodating recess 46 opens (upward in FIG. 5) and the width of the projection 46f is reduced toward a distal end in the projection direction. In a state before the cover 61 is fixed to the gear housing 41 (shown by long dashed double-short dashed lines in FIG. 5), a distal end surface 46g of the projection 46f is flat and parallel to the open end surface 46e.

The cover 61 includes an outer rib 62 that is located at an outer side of (outward from) the open end surface 46e of the circuit accommodating recess 46 and projects from an outer edge of the cover 61 toward the side of a front surface 61a and the side of a rear surface 61b of the cover 61. In other words, the cover 61 includes the outer rib 62 that is located at the outer side of the outer edge of the open end surface 46e of the circuit accommodating recess 46 in the direction orthogonal to the rotation axis direction of the output shaft 55 and projects from the outer edge of the cover 61 toward two sides (upper side and lower side in FIG. 5) in the rotation axis direction of the output shaft 55. The projection amount of the outer rib 62 toward the side of the front surface 61a is equal to the projection amount of the outer rib 62 toward the side of the rear surface 61b. In the present embodiment, the outer rib 62 has a rectangular cross section in a direction orthogonal to the direction in which the outer rib 62 extends.

As shown in FIGS. 5, 7A, and 7B, the cover 61 includes a first inner rib 63 and a second inner rib 64. The first inner rib 63 located at an inner side of (inward from) the open end surface 46e of the circuit accommodating recess 46 projects toward the side of the front surface 61a of the cover 61. The second inner rib 64 located at an inner side of (inward from) the open end surface 46e of the circuit accommodating recess 46 projects toward the side of the rear surface 61b of the cover 61. In other words, the cover 61 includes the first inner rib 63 and the second inner rib 64. The first inner rib 63 is located at the inner side of an inner edge of the open end surface 46e of the circuit accommodating recess 46 in the direction orthogonal to the rotation axis direction of the output shaft 55 and projects in a direction extending away from the circuit accommodating recess 46 in the rotation axis direction of the output shaft 55. The second inner rib 64 is located at the inner side of the inner edge of the open end surface 46e of the circuit accommodating recess 46 in the direction orthogonal to the rotation axis direction of the output shaft 55 and projects in a direction extending into the circuit accommodating recess 46 in the rotation axis direction of the output shaft 55. The first inner rib 63 and the second inner rib 64 each have a looped portion 65 arranged along an inner peripheral surface 46m of the open end 46c of the circuit accommodating recess 46. The looped portion 65 is extended while maintaining a constant distance from the outer rib 62. The first inner rib 63 and the second inner rib 64 each include reinforcements 66 at an inner side of the looped portion 65. In the present embodiment, the reinforcements 66 include ribs extending straight to divide the area at the inner side of the looped portion 65 into rectangle regions and ribs extending straight along the diagonal lines in each divided region.

The first inner rib 63 and the second inner rib 64 are shaped identically and formed at the same position on the front surface 61a and the rear surface 61b of the cover 61. The outer rib 62 is shaped identically on the front surface 61a and the rear surface 61b of the cover 61. Thus, the shape of the front surface 61a is line-symmetric to the shape of the rear surface 61b of the cover 61. In the present embodiment, the height (amount of projection) of the outer rib 62 and the height of the first inner rib 63 from the front surface 61a are the same, and a distal end surface 62a of the outer rib 62 and a distal end surface 63a of the first inner rib 63 on the side of the front surface 61a are located on the same plane. Likewise, the height (amount of projection) of the outer rib 62 and the height of the second inner rib 64 on the rear surface 61b are the same, and a distal end surface 62b of the outer rib 62 and a distal end surface 64a of the second inner rib 64 at the side of the rear surface 61b are located on the same plane.

As shown in FIG. 5, the cover 61 is arranged on the gear housing 41 in a state in which the rear surface 61b is directed toward the gear housing 41 (circuit board 56). Specifically, the cover 61 is arranged on the gear housing 41 so that the outer rib 62 is located further toward an outer side of (outward from) the gear housing 41 than the open end surface 46e (outer edge of the open end surface 46e) and so that an inner peripheral surface 62c of the outer rib 62 projecting from the side of the rear surface 61b faces an outer peripheral surface 46n of the open end 46c of the circuit accommodating recess 46. A portion of the cover 61 located inward from the outer rib 62 and outward from the second inner rib 64 is opposed to the open end 46c (open end surface 46e) of the circuit accommodating recess 46 in the direction in which the cover 61 overlaps the gear housing 41 (vertical direction in FIG. 5. The portion on the rear surface 61b of the cover 61 located outward from the looped portion 65 of the second inner rib 64 and inward from the outer rib 62 is a flat fixing surface 61c that faces the open end 46c (open end surface 46e) of the circuit accommodating recess 46. In a state before the cover 61 is fixed to the gear housing 41, the fixing surface 61c of the cover 61 abuts the distal end surface 46g of the projection 46f of the gear housing 41 in plane contact.

The cover 61, which is arranged on the gear housing 41 to close the opening 46a of the circuit accommodating recess 46, and the projection 46f are laser-welded and fixed to the portion of the cover 61 opposing the projection 46f over the entire periphery of the cover 61. In this manner, the cover 61 is welded to the gear housing 41 over the entire periphery of the cover 61, more specifically, over the entire periphery of the open end 46c to obtain the liquid tightness between the cover 61 and the gear housing 41.

As shown in FIGS. 1 to 3, in the above motor 10, the current supplied to the motor 10 from an external power supply via the connector 47 is supplied to the commutator 26 (and to windings of rotor 21) through the connector terminal 58, the circuit board 56, the terminals 29, the choke coils 28, and the power brushes 27. This drives and rotates the rotor 21 (rotary shaft 22) and the rotation of the rotary shaft 22 is transmitted to the worm shaft 53. The rotation of the rotary shaft 22 transmitted to the worm shaft 53 is reduced in speed by the worm shaft 53 and the worm wheel 54 and output from the output shaft 55. The window glass of the vehicle is raised and lowered in accordance with the rotation direction of the output shaft 55. In this case, the entrapment prevention controller of the circuit board 56 detects the rotation speed and the number of revolutions of the rotary shaft 22 using the Hall IC 57 that detects the magnetic field of the sensor magnet 30, which is rotated integrally with the rotary shaft 22. If the entrapment prevention controller of the circuit board 56 determines, for example, that foreign material is entrapped by the window glass, the entrapment prevention controller stops the rotation of the rotary shaft 22 (stops power supply to rotor 21) or supplies power to the rotor 21 so as to lower the window glass.

The operation of the first embodiment will now be described.

As shown in FIG. 5, the cover 61 includes the outer rib 62, which projects from the outer edge of the cover 61 toward the side of the front surface 61a and the side of the rear surface 61b of the cover 61 at the outer circumference from the open end surface 46e of the circuit accommodating recess 46. The cover 61 further includes the first inner rib 63, which projects toward the side of the front surface 61a of the cover 61 at the inner side from the open end surface 46e of the circuit accommodating recess 46, and the second inner rib 64, which projects toward the side of the rear surface 61b of the cover 61 at the inner side from the open end surface 46e. Thus, the outer rib 62, the first inner rib 63, and the second inner rib 64 restrict warping of the cover 61, which is made of synthetic resin. The cover 61 is welded and fixed to the open end 46c of the circuit accommodating recess 46 at the portion inward from the outer rib 62 and outward from the first and second inner ribs 63, 64.

The first embodiment has the following advantages.

(1) The outer rib 62, the first inner rib 63, the second inner rib 64 restrict warping of the cover 61. This improves the seal between the open end 46c of the circuit accommodating recess 46 and the cover 61 even if the cover 61 is decreased in thickness. Accordingly, the open end 46c of the circuit accommodating recess 46 and the cover 61 are welded in a preferred manner. This ensures the liquid tightness between the open end 46c of the circuit accommodating recess 46 and the cover 61.

(2) The looped portion 65 of the first and second inner ribs 63, 64 extends along the inner peripheral surface 46m of the open end 46c of the circuit accommodating recess 46. This further restricts warping of the portion of the cover 61 opposing the open end 46c (open end surface 46e) of the circuit accommodating recess 46, that is, the portion fixed to the open end 46c. Thus, reduction in the flatness of the portion (fixing surface 61c) of the cover 61 opposing the open end 46c of the circuit accommodating recess 46 is further limited. This further improves the seal between the open end 46c of the circuit accommodating recess 46 and the cover 61 even if the cover 61 is decreased in thickness. Accordingly, the open end 46c of the circuit accommodating recess 46 and the cover 61 are welded in a further preferred manner. This further ensures the liquid tightness between the open end 46c of the circuit accommodating recess 46 and the cover 61.

(3) The open end surface 46e of the circuit accommodating recess 46 includes the looped projection 46f extending along the open end 46c of the circuit accommodating recess 46 and having a width that decreases toward the distal end in the projection direction. The cover 61, which is arranged on the gear housing 41 to close the opening 46a of the circuit accommodating recess 46, abuts the distal end surface 46g of the projection 46f. The area of the distal end surface 46g of the projection 46f is smaller than the area of the open end surface 46e of the circuit accommodating recess 46. Thus, the distal end surface 46g of the projection 46f is flattened more easily than the open end surface 46e of the circuit accommodating recess 46. Since the flatness of the portion of the gear housing 41 that abuts the cover 61 can be easily increased, the seal between the open end 46c of the circuit accommodating recess 46 and the cover 61 can be further improved. Accordingly, the open end 46c of the circuit accommodating recess 46 and the cover 61 are welded in a further preferred manner. This further ensures the liquid tightness between the open end 46c of the circuit accommodating recess 46 and the cover 61.

(4) The portion of the outer rib 62 projecting from the cover 61 at the side of the front surface 61a is shaped identically to the portion of the outer rib 62 projecting from the cover 61 at the side of the rear surface 61b so that the front surface 61a and the rear surface 61b of the cover 61 both have surfaces that can be fixed to the open end 46c of the circuit accommodating recess 46. Thus, a single type of the cover 61 can be used to close the openings 46a of the circuit accommodating recess 46 in two types of motors in which the openings 46a of the circuit accommodating recesses 46 are line-symmetric as viewed in the direction in which the circuit accommodating recesses 46 extend. Accordingly, the number of types of the cover 61 can be deceased to reduce the production cost of the motor 10. For example, a motor serving as a drive source of a power window device that raises and lowers a window lass on the right side of a vehicle and a motor serving as a drive source of a power window device that raises and lowers a window glass on the left side of the vehicle have gear housings 41 that are line-symmetric as viewed in the motor flat orthogonal direction. Thus, the openings 46a of the circuit accommodating recesses 46 are line-symmetric. In this manner, one type of the cover 61 can be used for two types of motors, and a separate cover does not have to be formed for each motor.

(5) The Hall IC 57 is configured to simultaneously detect an upright magnetic field, which enters the Hall IC 57 in the vertical direction, and a transverse magnetic field, which enters the Hall IC 57 in the horizontal direction. Thus, the circuit board 56 including the Hall IC 57 can be located at a position that does not overlap the rotary shaft 22 in the motor flat orthogonal direction as viewed in the direction of rotation axis L1 so that the thickness direction of the circuit board 56 is parallel to the motor flat orthogonal direction. That is, the Hall IC 57 does not need to be located at a position that is inside the motor flat direction range A1 of the rotary shaft 22 and opposed to the sensor magnet 30 in the diameter direction of the sensor magnet 30 as viewed in the direction of rotation axis L1. Thus, circuit board 56 does not necessarily need to be extended to a position that overlaps the rotary shaft 22 in the motor flat orthogonal direction as viewed in the direction of rotation axis L1. Further, the circuit board 56 can be reduced in size in the motor flat direction. When the circuit board 56 is reduced in size, the opening 46a of the circuit accommodating recess 46 can also be reduced in size in accordance with the size of the circuit board 56. That is, the opening 46a of the circuit accommodating recess 46 is formed in a range that does not overlap the rotary shaft 22 as viewed in the motor flat orthogonal direction. The cover 61 that closes the opening 46a of the circuit accommodating recess 46 is reduced in size by forming the cover 61 that does not overlap the rotary shaft 22 in the motor flat orthogonal direction. When the cover 61 is reduced in size, the amount of resin required for the cover 61 can be reduced. This reduces the material cost of the cover 61.

In the present embodiment, the circuit board 56 is located at a position that does not overlap line L11 but overlaps the sensor magnet 30 in the motor flat direction as viewed in the direction of rotation axis L1. Thus, distance D1 between rotation axis L1 and the circuit board 56 as viewed in the direction of rotation axis L1 can be reduced as compared with when the Hall IC is located at a position that is inside the motor flat direction range of the rotary shaft and opposed to the sensor magnet in the diameter direction of the sensor magnet. This allows the cover 61 to include the outer rib 62, the first inner rib 63, and the second inner rib 64 without increasing the thickness of the motor 10 in the motor flat orthogonal direction.

(6) The outer rib 62 is located further outward from the gear housing 41 than the open end surface 46e of the circuit accommodating recess 46, and the inner peripheral surface 62c of the outer rib 62 projecting toward the side of the rear surface 61b is opposed to the outer peripheral surface 46n of the open end 46c of the circuit accommodating recess 46. That is, the outer rib 62 is arranged to cover the outer circumference of the open end 46c of the circuit accommodating recess 46. Thus, the outer rib 62 prevents burrs produced between the open end surface 46e of the circuit accommodating recess 46 and the fixing surface 61c of the cover 61 front being exposed from the motor 10 when the cover 61 is welded and fixed to the open end 46c of the circuit accommodating recess 46. This prevents burrs from affecting the appearance of the motor 10. The outer rib 62 limits contact of burrs and prevents separation of the burrs caused by contact with foreign material or the like. This prevents separated burrs from stopping an assembly line when the motor 10 is manufactured.

(7) When the cover 61 is fixed through ultrasonic welding to the open end 46c of the circuit accommodating recess 46, the cover 61 and the gear housing 41 are oscillated at a specific frequency. Thus, the circuit board 56 may be damaged by vibration or dust. In this case, a he circuit board 56 is usually checked to obtain the resonance point (resonance frequency) that prevents resonance between the circuit board 56 and the cover 61 and the gear housing 41 when performing ultrasonic welding. Thus, the resonance point of the circuit board 56 is obtained whenever changing the components mounted on the circuit board 56 or the specifications of the circuit board 56. This increases the production cost of the motor 10.

In the present embodiment, however, the cover 61 is laser-welded and fixed to the open end 46c of the circuit accommodating recess 46. This does not oscillate the cover 61 or the gear housing 41 when the cover 61 is fixed to the open end 46c. Thus, the circuit board 56 will not be damaged by vibration or dust. There is also no need to obtain the resonance point even if mounted parts or the specifications of the circuit board 56 are changed. This allows the mounted parts or the specifications of the circuit board 56 to be easily changed. Thus, the production cost of the motor 10 is reduced front a case in which the cover 61 is welded, by ultrasonic welding, to the open end 46c of the circuit accommodating recess 46.

(8) The outer rib 62 is located outward from the open end surface 46e of the circuit accommodating recess 46 so that the outer rib 62 is opposed to the outer peripheral surface 46n of the open end 46c of the circuit accommodating recess 46. The outer rib 62 allows the cover 61 to be positioned relative to the gear housing 41. The outer rib 62 is arranged on the outer edge of the cover 61 so that the cover 61 closes the opening 46a of the circuit accommodating recess 46 when the cover 61 is located on the gear housing 41 as long as the outer rib 62 is located outward from the open end surface 46e of the circuit accommodating recess 46. The dimensional accuracy of the cover 61 does not need to be high by positioning the cover 61 relative to the gear housing 41 with the outer rib 62. As a result, the cost of the cover 61 can be further reduced.

The first embodiment may be modified as described below.

Figure 8:
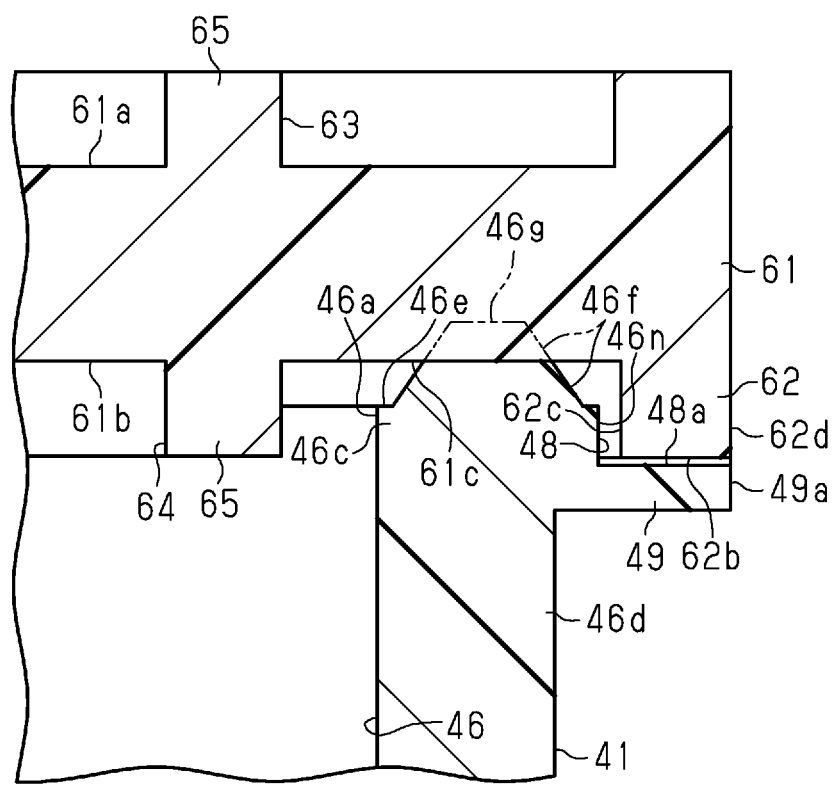
FIG. 8 is a cross-sectional view of a motor according to a further embodiment.

As shown in FIG. 8, the gear housing 41 may include a step 48 on the outer peripheral surface 46n of the open end 46c of the circuit accommodating recess 46, on which the outer rib 62 is arranged. The step 48 is formed to reduce the size of the contour of the open end 46c. The step 48 opens in the same direction (upward in FIG. 8) as the opening direction of the circuit accommodating recess 46 and toward the outer side of the circuit accommodating recess 46. The step 48 is shaped to be lower toward the bottom of the circuit accommodating recess 46 (downward in FIG. 8) than the open end surface 46e of the circuit accommodating recess 46. The cover 61 is arranged on the gear housing 41 so that the outer rib 62 is arranged on the step 48. The outer rib 62 is arranged on the step 48 so that the distal end surface 62b at the side of the rear surface 61b faces a bottom surface 48a of the step 48.

In this manner, the step 48, on which the outer rib 62 extending along the periphery of the cover 61 is arranged, includes the outer peripheral surface 46n of the open end 46c of the circuit accommodating recess 46. This reduces the size of the contour of the cover 61. The smaller contour of the cover 61 reduces the size of the cover 61 and decreases the amount of resin required for the cover 61. This lowers the material cost of the cover 61. Further, the motor 10 is reduced in size.

The outer rib 62 does not entirely have to overlap the bottom surface 48a of the step 48 in the direction in which the cover 61 overlaps the gear housing 41 (vertical direction in FIG. 8). The cover 61 can have a smaller contour and the cover 61 can be reduced in size as long as the outer rib 62 is arranged on the step 48 so that at least the portion at the inner side of the outer rib 62 overlaps the bottom surface 48a of the step 48 in the direction in which the cover 61 overlaps the gear housing 41.

In the example shown in FIG. 8, a portion of the step 48 (bottom of step 48) opposing the outer rib 62 in the direction in which the cover 61 overlaps the gear housing 41 includes a separation restricting projection 49 that projects outward from the open end 46c of the circuit accommodating recess 46 and extends along the open end 46c opposed to the distal end surface 62b of the outer rib 62. The separation restricting projection 49 includes an outer peripheral surface 49a (distal end surface) that is flush with the outer peripheral surface 62d of the outer rib 62.

In this manner, the separation restricting projection 49 prevents foreign material or the like from coming into contact with the outer rib 62 in the direction in which the cover 61 is separated from the gear housing 41. This restricts separation of the cover 61 from the gear housing 41.

In the example shown in FIG. 8, the outer peripheral surface 49a of the separation restricting projection 49 is flush with the outer peripheral surface 62d of the outer rib 62. Instead, the outer peripheral surface 49a of the separation restricting projection 49 may be located outward from the outer peripheral surface 62d of the outer rib 62. This also restricts separation of the cover 61 from the gear housing 41.

Further, in the example shown in FIG. 8, the gear housing 41 includes the separation restricting projection 49 on the step 48. Instead of arranging the step 48 on the open end 46c of the circuit accommodating recess 46, the gear housing 41 may include a separation restricting projection that projects outward from the open end 46c of the circuit accommodating recess 46 and extends along the open end 46c opposed to the distal end surface 62b of the outer rib 62. An outer peripheral surface of the separation restricting projection is flush with the outer peripheral surface 62d of the outer rib 62 or may be located outward from the outer peripheral surface 62d of the outer rib 62. This also restricts separation of the cover 61 from the gear housing 41.

In the first embodiment, the opening 46a of the circuit accommodating recess 46 is arranged in a range that does not overlap the rotary shaft 22 as viewed in the motor flat orthogonal direction. Instead, the opening 46a of the circuit accommodating recess 46 may be arranged in a range that overlaps the rotary shaft 22 as viewed in the motor flat orthogonal direction. The cover 61 may be sized to overlap the rotary shaft 22 in the motor flat orthogonal direction in accordance with the shape of the circuit accommodating recess 46.

In the first embodiment, the circuit board 56 is located at the position that does not overlap line L11 but overlaps the sensor magnet 30 in the motor flat direction as viewed in the direction of rotation axis L1. Instead, the circuit board 56 may be located at a position that overlaps line L11 and overlaps the sensor magnet 30 in the motor flat orthogonal direction as viewed in the direction of rotation axis L1.

In the first embodiment, the circuit board 56 is located at the position that does not overlap the rotary shaft 22 in the motor flat orthogonal direction as viewed in the direction of rotation axis L1 so that the thickness direction of the circuit board 56 is parallel to the motor flat orthogonal direction. Instead, the circuit board 56 may be located at a position that overlaps the rotary shaft 22 in the motor flat orthogonal direction as viewed in the direction of rotation axis L1 so that the thickness direction of the circuit board 56 is parallel to the motor flat orthogonal direction.

In the first embodiment, the Hall IC 57 is located outside the motor flat direction range A1 of the rotary shaft 22 as viewed in the direction of rotation axis L1. Instead, the Hall IC 57 may be located inside motor flat direction range A1 of the rotary shaft 22 as viewed in the direction of rotation axis L1.

In the first embodiment, the circuit board 56 includes, as a magnetic sensor that detects a magnetic field of the sensor magnet 30, the Hall IC 57, which is configured to simultaneously detect an upright magnetic field entering the Hall IC 57 in the vertical direction and a transverse magnetic field entering the Hall IC 57 in the horizontal direction. Instead, the magnetic sensor of the circuit board 56 may be a Hall IC configured to detect only the upright magnetic field or the transverse magnetic field. Further, the magnetic sensor does not have to be a Hall IC.

In the outer rib 62 of the first embodiment, the portion projecting from the side of the front surface 61a of the cover 61 has the same shape as the portion projecting from the side of the rear surface 61b of the cover 61. Instead, in the outer rib 62, the portion projecting from the side of the front surface 61a of the cover 61 may be shaped differently from the portion projecting from the side of the rear surface 61b of the cover 61. The outer rib 62 may be, for example, shaped so that the portion projecting from the side of the front surface 61a differs in height or shape from the portion projecting from the side of the rear surface 61b of the cover 61.

In the first embodiment, the open end surface 46e of the circuit accommodating recess 46 includes the projection 46f. Instead, the fixing surface 61c of the cover 61 may include the projection 46f. In this manner, the distal end surface 46g of the projection 46f of the cover 61 arranged on the gear housing 41 to close the opening 46a of the circuit accommodating recess 46 abuts the open end surface 46e of the circuit accommodating recess 46. The area of the distal end surface 46g of the projection 46f is smaller than the area of the fixing surface 61c of the cover 61 (specifically, portion of cover 61 opposing open end surface 46e of circuit accommodating recess 46). Thus, the distal end surface 46g of the projection 46f is flattened more easily than the fixing surface 61c. Since the flatness of the portion of the cover 61 that abuts the gear housing 41 (open end 46c of the circuit accommodating recess 46) can be easily increased, the seal between the open end 46c of the circuit accommodating recess 46 and the cover 61 can be further improved. Accordingly, the open end 46c of the circuit accommodating recess 46 and the cover 61 are welded in a further preferred manner. This further ensures the liquid tightness between the open end 46c of the circuit accommodating recess 46 and the cover 61.

The motor 10 does not necessarily have to include the projection 46f. In this case, the fixing surface 61c of the cover 61 abuts the open end surface 46e of the circuit accommodating recess 46, and the open end surface 46e and the fixing surface 61c are fixed.

In the first embodiment, the first and second inner ribs 63, 64 both include the looped portion 65. However, both of the first and second inner ribs 63, 64 do not have to include the looped portion 65. Further, the first and second inner ribs 63, 64 both include the reinforcements 66. However, both of the first and second inner ribs 63, 64 do not have to include the reinforcements 66. In the above embodiment, the first inner rib 63 and the second inner rib 64 are shaped identically. Instead, the first inner rib 63 and the second inner rib 64 may be shaped differently.

In the first embodiment, the cover 61 includes the first inner rib 63 at the side of the front surface 61a and the second inner rib 64 at the side of the rear surface 61b. However, one of the first and second inner ribs 63, 64 may be omitted from the cover 61.

In the first embodiment, the circuit accommodating recess 46 extends in the motor flat orthogonal direction. However, the direction in which the circuit accommodating recess 46 extends is not limited in such a manner. The circuit accommodating recess 46 only needs to be able to accommodate the circuit board 56 in the gear housing 41.

In the first embodiment, the cover 61 is laser-welded and fixed to the open end 46e of the circuit accommodating recess 46. However, the cover 61 does not have to be fixed to the open end 46c of the circuit accommodating recess 46 in this manner. The cover 61 may be fixed to the open end 46c of the circuit accommodating recess 46 through, for example, ultrasonic welding. The cover 61 may be, for example, adhered and fixed to the open end 46c of the circuit accommodating recess 46. The gear housing 41 may be made of a metal material instead of synthetic resin when the cover 61 is adhered and fixed to the open end 46c of the circuit accommodating recess 46.

In the first embodiment, the motor 10 includes a reduction mechanism that includes the worm shaft 53 and the worm wheel 54 and reduces the speed of the rotation of the rotary shaft 22. However, the motor 10 does not necessarily have to include the reduction mechanism. The motor 10 may output the rotation of the rotary shaft 22 without reducing the speed.

In the first embodiment, the motor 10 is used as the drive source of the power window device. Instead, the motor 10 may be used as a drive source of a device other than the power window device.

A motor and a motor manufacturing method according to a second embodiment will now be described. Same reference numerals are given to those components that are the same as the corresponding components of the first embodiment. Such components will not be detailed in detail.

Figure 11:
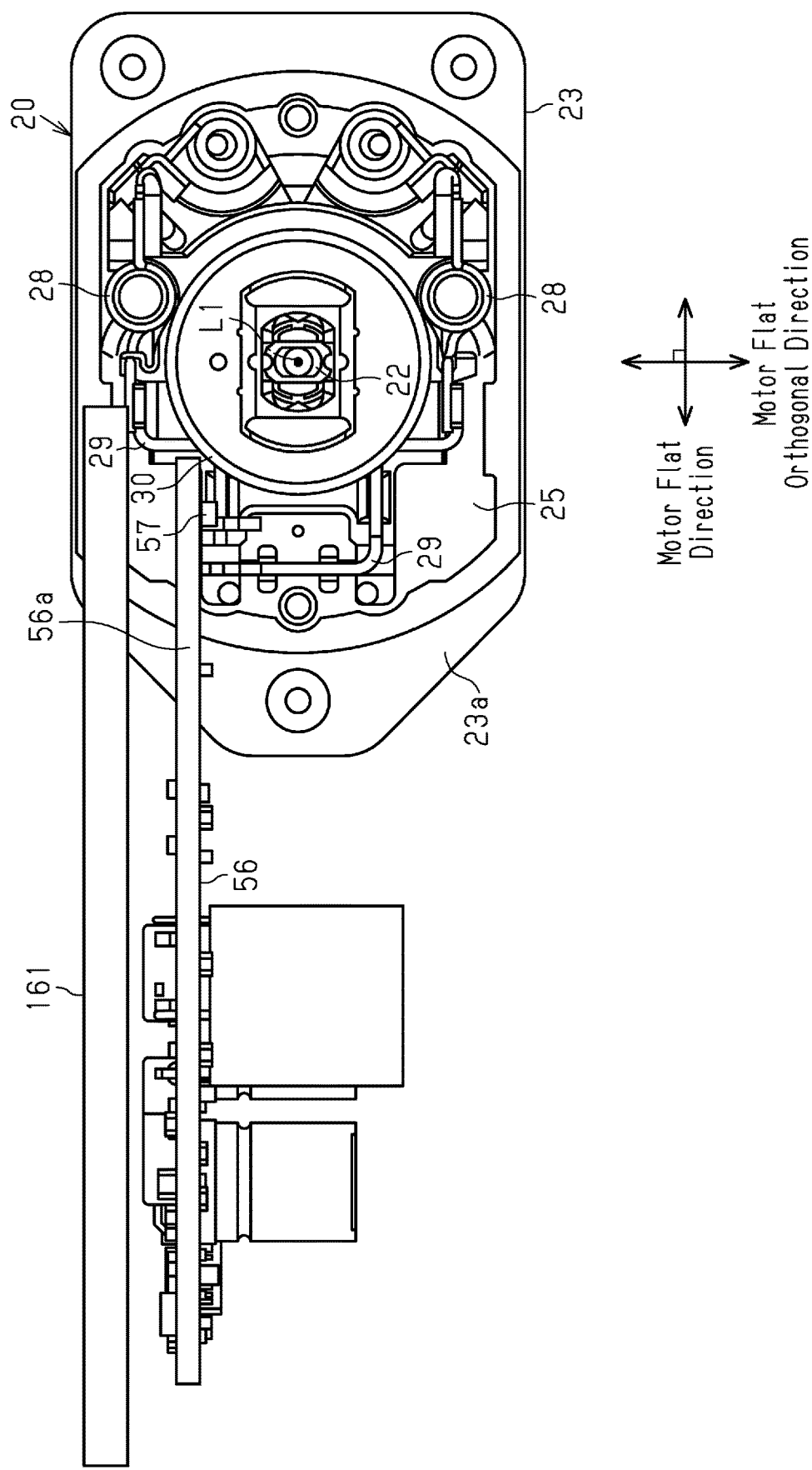
FIG. 11 is a diagram showing an arrangement of a motor unit, a circuit board, and a cover shown in FIG. 9.

As shown in FIG. 11, the circuit board 56 is located in a range of the diameter of the sensor magnet 30 in the motor flat direction and the output unit 40 (motor 10) is reduced in thickness. Further, an end of an extension 56a of the circuit board 56 on which the Hall IC 57 is mounted is located in the range of the diameter of the sensor magnet 30 in the motor flat orthogonal direction so that the Hall IC 57 can be located as close as possible to the sensor magnet 30.

Figure 9:
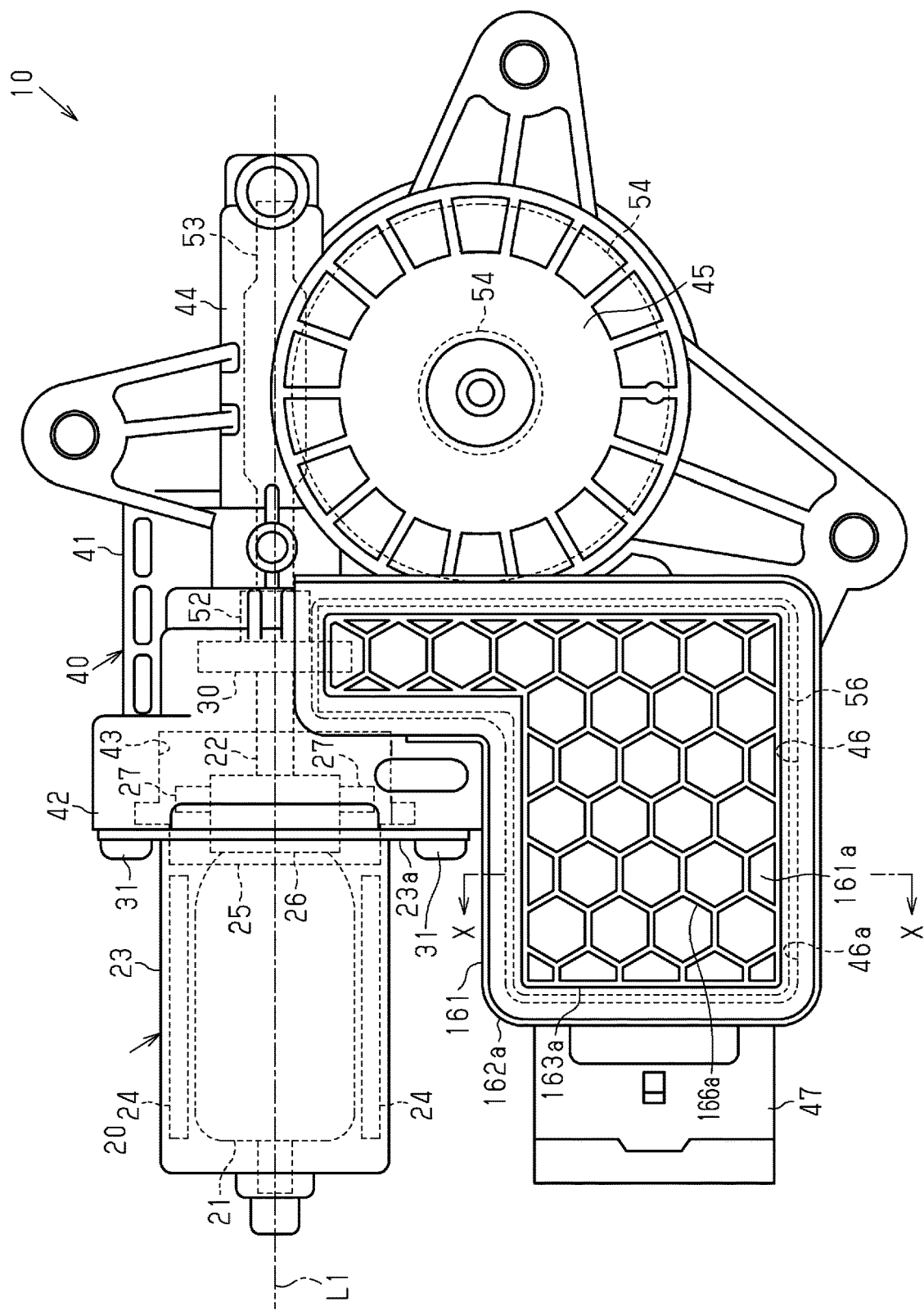
FIG. 9 is a front view of a motor according to a second embodiment.
Figure 12:
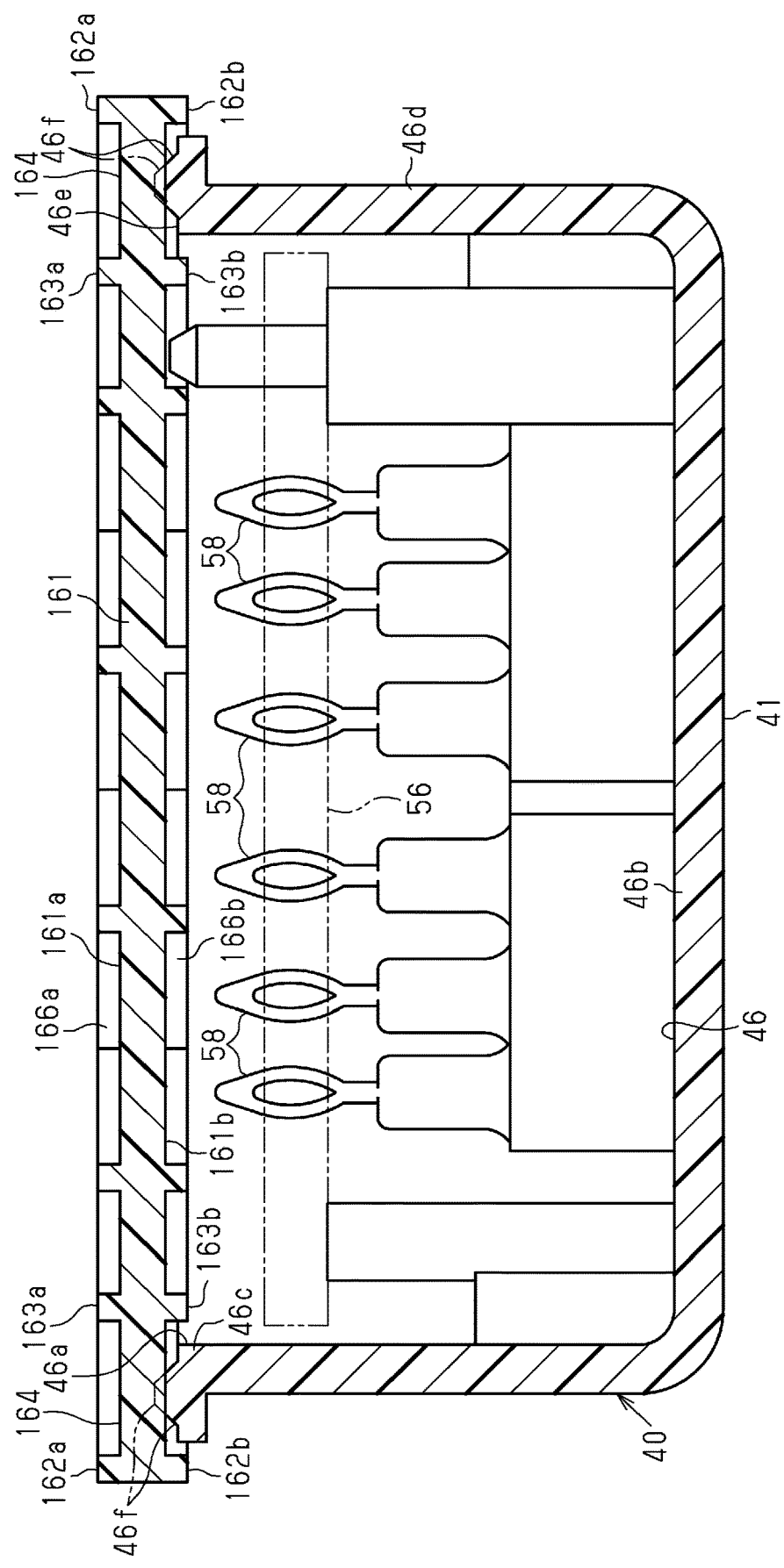
FIG. 12 is a cross-sectional view of the cover and the circuit accommodating recess taken along line X-X in FIG. 9.

As shown in FIGS. 9 and 12, the opening 46*a* of the circuit accommodating recess 46 is closed by a cover 161, which is made of synthetic resin. The cover 161 is substantially L-shaped and flat in accordance with the shape of the opening 46*a* of the circuit accommodating recess 46. A welding device 70 (refer to FIG. 15) for laser welding and a welding method will be described below.

The open end 46*c* of the circuit accommodating recess 46 is a distal end of the side wall 46*d* extending along a peripheral edge of the circuit accommodating recess 46. The open end surface 46*e* (distal end surface of side wall 46*d*) includes the looped projection 46*f* extending along the open end 46*c* of the circuit accommodating recess 46. In a state before the cover 161 is fixed to the gear housing 41 (shown by double-short dashed lines in FIG. 13), the projection 46*f* has a width, which is reduced toward a distal end in the projection direction, and a trapezoidal cross section in which the distal end surface 46*g* of the projection 46*f* is flat. In a state in which the cover 161 (fixing portion 164) is placed on the distal end surface 46*g* of the projection 461, a distal end portion of the projection 46*f* and its peripheral portion are melted through laser welding to seal the open end 46*c* of the circuit accommodating recess 46 and the cover 161.

Figure 13:
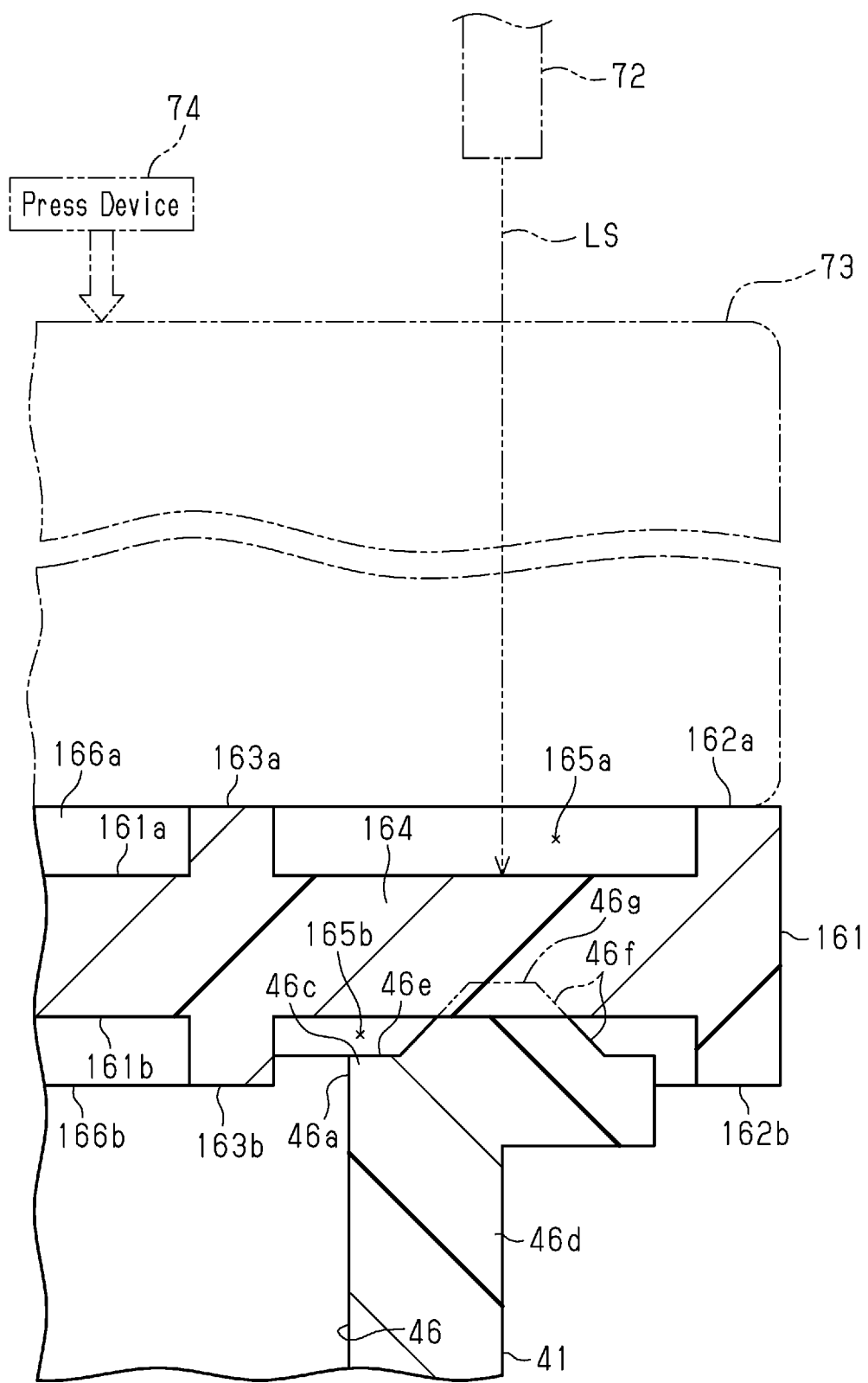
FIG. 13 is a partially enlarged cross-sectional view of the cover and the circuit accommodating recess shown in FIG. 12.
Figure 14A:
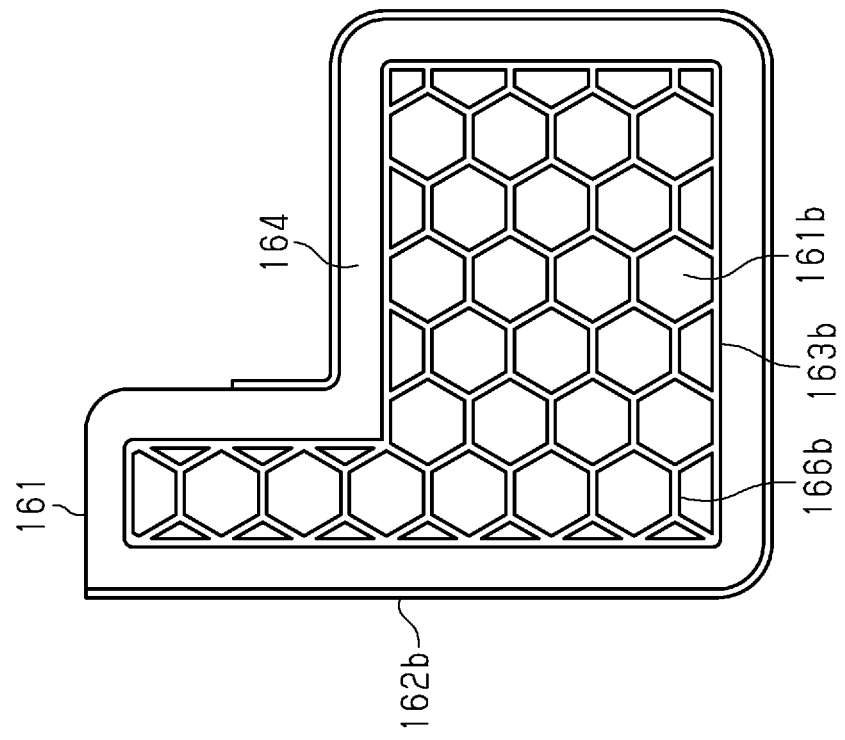
FIG. 14A is a front view of the cover shown in FIG. 9.
Figure 14B:
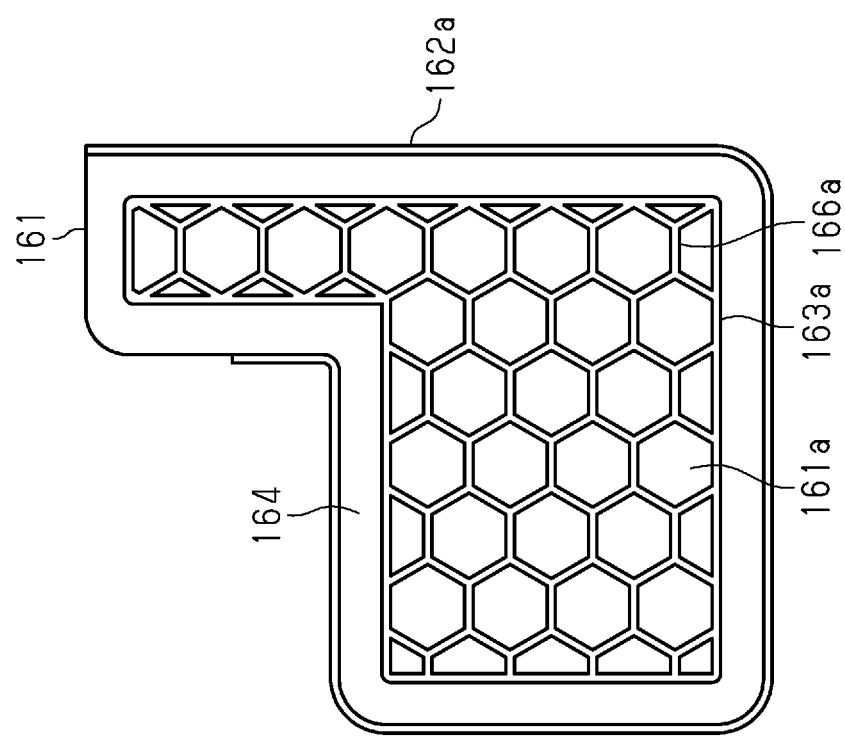
FIG. 14B is a rear view of the cover shown in FIG. 9.

As shown in FIGS. 13 and 14A, 14B, the cover 161 includes a front surface outer rib 162*a* and a rear surface outer rib 162*b*, which project from a peripheral edge of the cover 161 toward the side of a front surface 161*a* and the side of a rear surface 161*b* of the cover 161 at an outer side of the open end surface 46*e* of the circuit accommodating recess 46. The front and rear surface outer ribs 162*a*, 162*b* have identical rectangular cross sections so that the amount of projection is equal in the front surface 161*a* and the rear surface 161*b*. The front and rear surface outer ribs 162*a*, 162*b* are looped-shapes in conformance with the contour of the cover 161. The looped-shape is not completely closed and includes an open part. The periphery of the cover 161 that does not include the outer ribs 162*a*, 162*b* is opposed to part of the fixed portion 42.

The cover 161 includes a front surface inner rib 163*a* and a rear surface inner rib 163*b*, which project toward the side of the front surface 161*a* and side of the rear surface 161*b* of the cover 161 and inward from the open end surface 46*e* of the circuit accommodating recess 46. The front and rear surface inner ribs 163*a*, 163*b* have identical rectangular cross sections so that the amount of projection is equal in the front surface 161*a* and the rear surface 161*b* and equal to the amount of projection of the front and rear surface outer ribs 162*a*, 162*b*. The front and rear surface inner ribs 163*a*, 163*b* are shaped as completely closed loops in conformance with the contour of the cover 161.

A flat portion extending from the front and rear surface inner ribs 163*a*, 163*b* to the front and rear surface outer ribs 162*a*, 162*b* define the fixing portion 164 fixed to the open end 46*c* (projection 461) of the circuit accommodating recess 46. The width of the fixing portion 164 (distance from inner ribs 163*a*, 163*b* to outer ribs 162*a*, 162*b*) is set to be slightly greater than the open end 46*c* of the circuit accommodating recess 46 so that the ribs 163*a*, 163*b* and the ribs 162*a*, 162*b* do not contact the open end 46*c*. Laser welding melts the resin of the distal end portion of the projection 46*f* and its peripheral portion melted between the open end 46*c* and the ribs 162*b*, 163*b*. A recessed portion surrounded by the fixing portion 164, the front surface inner rib 163*a*, and the front surface outer rib 162*a* defines a front surface recess 165*a*. A recessed portion surrounded by the fixing portion 164, the rear surface inner rib 163*b*, and the rear surface outer rib 162*b* defines a rear surface recess 165*b*. In FIG. 13, the front surface 161*a* of the cover 161 is directed toward the outside so that the front surface recess 165*a* is exposed to the outside and the open end 46*c* (projection 460 of the circuit accommodating recess 46 is located in the rear surface recess 165*b*.

Inner portions of the front and rear surface inner ribs 163*a*, 163*b* include front surface reinforcing ribs 166*a* and rear surface reinforcing ribs 166*b* that project from the front surface 161*a* and the rear surface 161*b* of the cover 161 and reinforce the inner portions. The front and rear surface reinforcing ribs 166*a*, 166*b* have identical rectangular cross sections so that the amount of projection is equal in the front surface 161*a* and the rear surface 161*b* and equal to the amount of projection of the front and rear surface inner ribs 163*a*, 163*b* (front and rear surface outer ribs 162*a*, 162*b*). The front and rear surface reinforcing ribs 166*a*, 166*b* extend to be honeycomb-shaped and include regular hexagons on the front surface 161*a* and the rear surface 161*b* of the cover 161 in a plan view and are connected to the front and rear surface inner ribs 163*a*, 163*b*. Parts of the honeycomb shape are formed by portions of the front and rear surface reinforcing ribs 166*a*, 166*b* connected to the front and rear surface inner ribs 163*a*, 163*b*.

As shown in FIGS. 14A and 14B, the cover 161 includes the front surface 161*a* and the rear surface 161*b* include the various types of ribs 162*a*, 162*b*, 163*a*, 163*b*, 166*a*, 166*b* as described above. The front surface 161*a* and the rear surface 161*b* are configured to be line-symmetric. This allows the same cover 161, which will have the same serial number, to be shared when manufacturing two types of the motors 10 that have symmetrical structures, more specifically, a motor in which the cover 161 is attached so that the side of the front surface 161*a* is exposed to the outside and a motor in which the cover 161 is attached so that the side of the rear surface 161*b* is exposed to the outside. Further, since the front surface 161*a* and the rear surface 161*b* are symmetrically shaped, it can be expected that deformation will not be biased in one of the side of the front surface 161*a* and the side of the rear surface 161*b* when molding the cover 161.

A welding device 70 used to weld the cover 161 and a welding method will now be described.

As shown in FIGS. 15A and 15B, the welding device 70 includes a support device 71 that supports the motor 10 and a laser beam emission unit 72 that emits a laser bean LS for performing laser welding on the cover 161. In addition, a glass jig 73, which serves as a transparent jig, is placed on an upper surface of the cover 161 to press the cover 161 while transmitting the laser beam LS and provide the laser beam LS to a welding portion of the cover 161. The glass jig 73 is formed by a transparent body, which has a predetermined thickness and is substantially L-shaped to substantially conform to the contour of the cover 161. The glass jig 73 is pressed by a press device 74.

A specific welding method includes positioning and placing the motor 10, without the cover 161, on the support device 71. Then the cover 161 is placed on the open end 46*c* (projection 46*f*) of the circuit accommodating recess 46. In this case, the cover 161 is placed in the direction that exposes the front surface 161*a* of the cover 161 to the outside. With respect to the circuit accommodating recess 46 and the cover 161, the projection 46*f* (distal end surface 46*g*) of the open end 46*c* abuts the fixing portion 164 of the cover 161 (refer to FIG. 13).

Then, the glass jig 73 is placed on the front surface 161a of the cover 161. The press device 74 presses the cover 161 toward the circuit accommodating recess 46 with the glass jig 73, and the fixing portion 164 of the cover 161 is pressed against the open end 46c (projection 46f) of the circuit accommodating recess 46. Preferably, when the fixing portion 164 of the cover 161 is pressed against the open end 46c (projection 46f) of the circuit accommodating recess 46, uniform pressure is applied over the entire periphery of the cover 161.

If the press device 74 presses the cover 161 in one direction with the glass jig 73, the difference between motors 10 resulting from dimensional errors may cause the cover 161 to be pressed in a biased manner against the circuit accommodating recess 46. The same applies to differences between glass jigs 73.

The support device 71 according to present embodiment includes a base 75 arranged at a predetermined position, a table 76 that holds and supports the motor 10, and a tilting portion 77 between the base 75 and the table 76. The table 76 is configured to be tillable relative to the base 75. That is, when the cover 161 is pressed in a biased manner against the circuit accommodating recess 46 and a pressing force acts on the cover 161 with the glass jig 73, the table 76 is automatically tilted to adjust the position of the motor 10 until reaching the degree at which the pressure applied to the entire periphery of the cover 161 is adjusted. In other words, the support device 71 resolves biased pressing of the cover 161 so that the press device 74 does not require a mechanism or the like that adjusts a pressing direction.

Then, in a state in which the cover 161 is uniformly pressed against the open end 46c (projection 46f) of the circuit accommodating recess 46 over the entire periphery, laser welding is performed with a laser beam LS emitted from the laser beam emission unit 72. The laser beam LS emitted from the laser beam emission unit 72 is transmitted through the glass jig 73 to irradiate the fixing portion 164 of the cover 161. This melts and fixes a lower surface of the fixing portion 164 to the open end 46c (projection 46f) of the circuit accommodating recess 46, which is pressed against the fixing portion 164. The laser welding is performed while the laser beam emission unit 72 is moved along the entire periphery of the fixing portion 164 of the cover 161 (projection 46f of circuit accommodating recess 46) so that the cover 161 and the circuit accommodating recess 46 are fixed in a liquid-tight manner to each other over the entire periphery. This prevents water from entering the circuit accommodating recess 46 and avoids damages or operational failures of the circuit board 56 in the circuit accommodating recess 46 that would be caused by wetting.

When the glass jig 73 presses the cover 161, the glass jig 73 is in abutment in a substantially uniform manner against the end surfaces of the front surface outer rib 162a, the front surface inner rib 163a, and the front surface reinforcing rib 166a of the cover 161. When laser welding is performed, the laser beam LS emitted from the laser beam emission unit 72 irradiates the fixing portion 164 (projection 46f of circuit accommodating recess 46) between the front surface outer rib 162a and the front surface inner rib 163a. That is, the front surface recess 165a is located in an optical path of the laser beam LS between the front surface outer rib 162a and the front surface inner rib 163a. Thus, the glass jig 73 is spaced apart from the fixing portion 164 of the cover 161, which is the portion irradiated with the laser beam LS. Thus, when the portion irradiated with the laser beam LS, such as the fixing portion 164, is burnt by laser welding and generates foreign material, such foreign material will not collect on the glass jig 73.

Consequently, since foreign material does not collect in the optical path of the laser beam LS, subsequent laser welding will not heat the glass jig 73 in the proximity of foreign material that would be collected on the glass jig 73. This limits cracking and fracturing that may lead to deterioration of transparency of the glass jig 73. Accordingly, the transmission of the laser beam LS is maintained in a preferred manner and the cover 161 remains welded to the circuit accommodating recess 46 over a long period. Although the cover 161 is described above as being fixed in the direction that exposes the front surface 161a of the cover 161 to the outside, the same applies when fixing the cover 161 in a direction that exposes the rear surface 161b to the outside.

Figure 10:
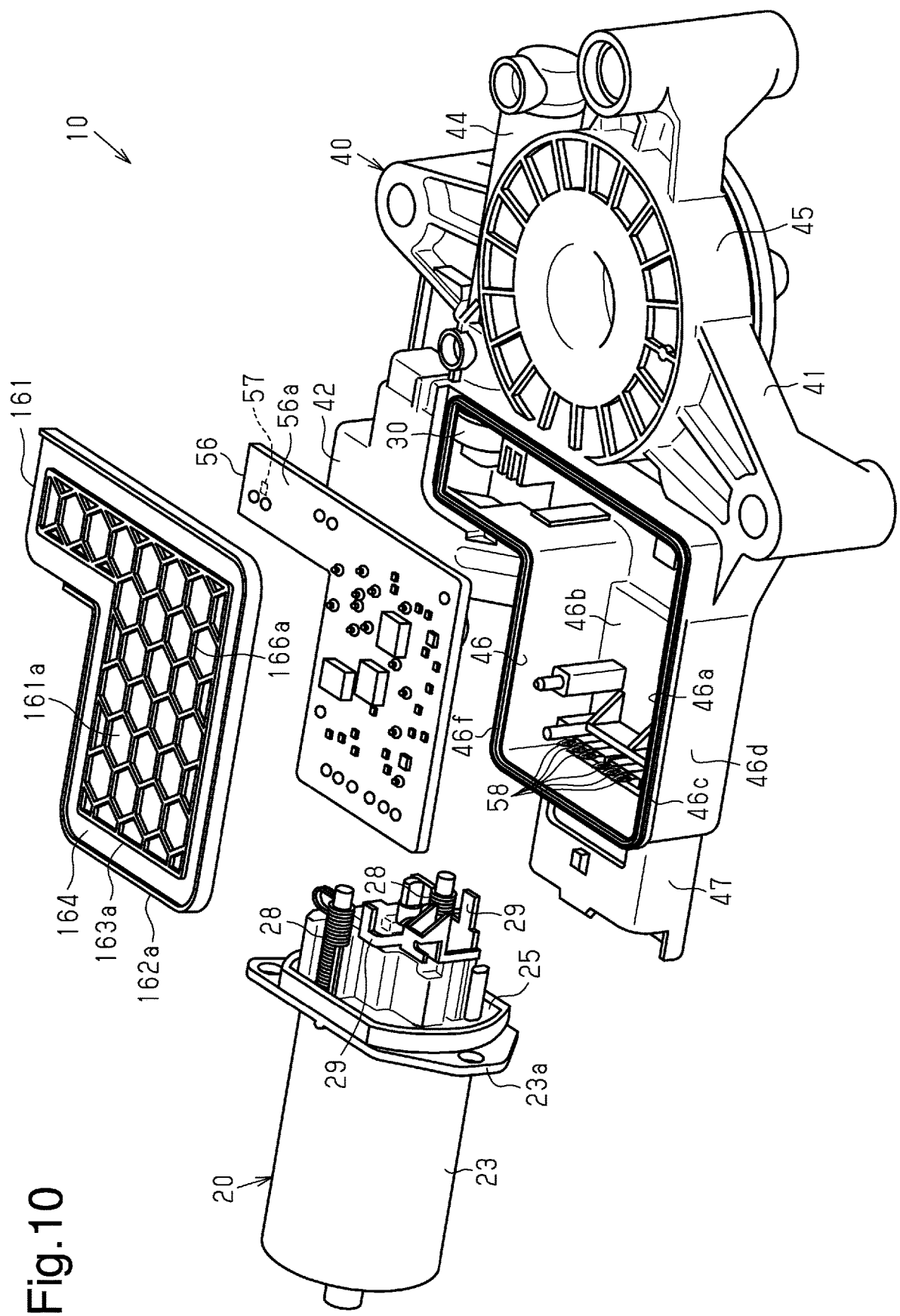
FIG. 10 is an exploded perspective view of the motor shown in FIG. 9.

The motor 10 configured in this manner as shown in FIGS. 9 to 11 is supplied with power from an external device through the connector 47. The power is further supplied to the windings of rotor 21 via the connector terminal 58, the circuit board 56, the terminals 29, the choke coils 28, the power brushes 27, and the commutator 26. This rotates the rotor 21 (rotary shaft 22). The rotation of the rotary shaft 22 is reduced in speed by the worm shaft 53 and the worm wheel 54 and output from the output shaft 55 to raise and lower (open and close) the window glass of the vehicle. The control circuit configured on the circuit board 56 included in the motor 10 detects the number of revolutions (rotation speed) or the like of the rotary shaft 22 based on the Hall IC 57 that detects magnetic field changes of the sensor magnet 30 rotated with the rotary shaft 22 and controls the rotation of the motor 10 to raise and lower the window glass. Further, if entrapment prevention control of the control circuit determines that foreign material is entrapped by the window glass, the entrapment prevention control reverses the window glass to a position that allows for release of the entrapped material or the like.

The second embodiment has the following advantages.

(9) The motor 10 according to the present embodiment is structured so that the fixing portion 164 of the cover 161, which is fixed by laser welding to the open end 46c of the circuit accommodating recess 46, is located in the recess 165a (165b) between the outer rib 162a (162b) and the inner rib 163a (163b) arranged at two sides of the fixing portion 164. Thus, laser welding is performed in a preferred manner by pressing the cover 161 toward the circuit accommodating recess 46 with the glass jig 73 and transmitting a laser beam LS through the glass jig 73 to irradiate the fixing portion 164 of the cover 161. Specifically, the glass jig 73 and the fixing portion 164 of the cover 161 are spaced apart by the recess 165a (165b) in the optical path of the laser beam LS so that burnt foreign material that may be generated during laser welding is prevented from collecting in the glass jig 73. The collection of foreign material in the glass jig 73 may lead to abnormally high temperatures in the proximity of foreign material that would be collected on the glass jig 73 in subsequent irradiation of foreign material with laser beam LS, which may generate cracks and fractures that may lead to deterioration of transparency of the glass jig 73. Thus, it is significant that burnt foreign material does not collect on the glass jig 73. Accordingly, the transmission of the laser beam LS through the glass jig 73 can be maintained in a preferred manner, and the welding of the cover 161 can be stably performed for a long period.

(10) The ribs 162a, 163a (162b, 163b) are arranged on two sides of the fixing portion 164 of the cover 161. The fixing portion 164 is located in the recess 165a (165b) between the ribs 162a, 163a (162b, 163b). This spaces apart the glass jig 73 and the fixing portion 164 of the cover 161 in the optical path of the laser beam LS. That is, the ribs 162a, 163a (162b, 163b) arranged as reinforcements or the like of the cover 161 space apart the glass jig 73 and the fixing portion 164 of the cover 161.

(11) The cover 161 includes the outer ribs 162a (162b) and the inner ribs 163a (163b). The inner sides of the inner ribs 163a (163b) include the reinforcing ribs 166a (166b) to increase the rigidity of the cover 161. In particular, the reinforcing ribs 166a (166b) according to the present embodiment are honeycomb-shaped with regular hexagons to further increase the rigidity of the cover 161. This minimizes deformation of the cover 161 when a pressing force acts on the cover 161 with the glass jig 73 during, for example, laser welding. Thus, the cover 161 is uniformly in abutment with the circuit accommodating recess 46 over the entire periphery and fixed more stably.

(12) The front surface 161a and the rear surface 161b of the cover 161 are shaped to be line-symmetric. This allows the same cover 161, which will have the same serial number, to be shared when manufacturing two types of the motors 10 that have symmetrical structures, more specifically, a motor in which the cover 161 is attached so that the side of the front surface 161a is exposed to the outside and a motor in which the cover 161 is attached so that the side of the rear surface 161b is exposed to the outside.

(13) The position of the motor 10 is adjusted by the support device 71 when a pressing force is received with the glass jig 73. Thus, the cover 161 uniformly abuts the circuit accommodating recess 46 against the entire periphery and is fixed more stably.

The second embodiment may be modified as described below. The second embodiment and the following modifications can be combined as long as the combined modifications are not in contradiction.

Figure 16:
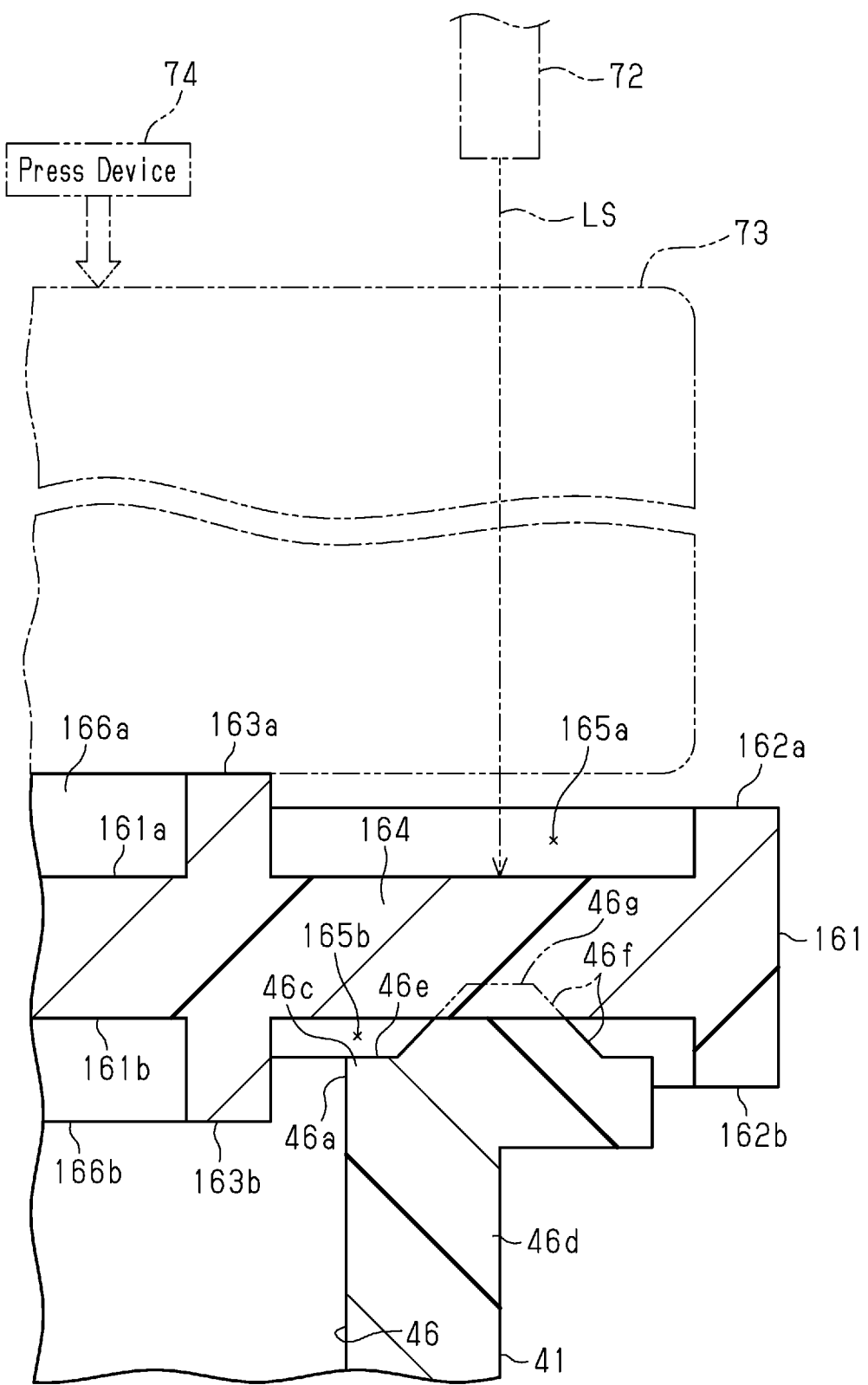
FIG. 16 is a partially enlarged cross-sectional view f a cover and a circuit accommodating recess in a modification.

In the second embodiment, the inner ribs 163a, 161b and the outer ribs 162a, 162b have the same projection height. Instead, for example, as shown in FIG. 16, the projection height of the inner ribs 163a, 163b may be greater than the projection height of the outer ribs 162a, 162b, and the glass jig 73 used in laser welding may be in abutment with the inner ribs 163a, 163b so that the pressing force of the glass jig 73 acts on the inner ribs 163a, 163b.

In this manner, the glass jig 73 does not have to abut the outer ribs 162a, 162b that is another portion located in the proximity of the circuit accommodating recess 46 of the gear housing 41. Thus, the glass jig 73 does not have to be accurately shaped (sized) and positioned to avoid interference between the glass jig 73 and the other portions. Further, the inner ribs 163a, 163b extending over the entire periphery of the cover 161 in the above embodiment, and the outer ribs 162a, 162b, which is partially non-continuous, is not subject to pressing by the glass jig 73. This allows a uniform pressing force to be applied over the entire periphery of the cover 161.

The ribs 162a, 163a (162b, 163b) that reinforce the cover 161 are arranged at two sides of the fixing portion 164 so that the fixing portion 164 of the cover 161 is located in the recess 165a (165b) to space apart the fixing portion 164 of the cover 161 from the glass jig 73. However, the fixing portion 164 of the cover 161 does not have to be spaced apart from the glass jig 73 in such a manner. Instead of the rib-shaped projections, simple projections can be used to restrict the position of the glass jig 73. A looped groove may be formed on the front surface 161a (rear face 161b) of the cover 161 and the fixing portion 164 may be arranged in the groove.

The reinforcing ribs 166a, 166b are honeycomb-shaped by regular hexagons. Instead, reinforcing ribs of other shapes may be used. For example, the reinforcing ribs may have other shapes and be X-shaped, lattice-shape, polygonal, or annular. The reinforcing ribs 166a, 166b may be omitted.

The front surface 161a and the rear surface 161b of the cover 161, which include various types of ribs 162a, 162b, 163a, 163b, 166a, 166b, are line-symmetric. Instead, the front surface 161a may be shaped differently from the rear surface 161b. The front surface 161a, for example, may include the various ribs 162a, 162b, 163a, 163b, 166a, 166b and the rear surface 161b may be flat.

The press device 74 directly presses the glass jig 73, and the glass jig 73 presses the cover 161 toward the circuit accommodating recess 46. Instead, the glass jig 73 may be fixed, and the press device 74 may press the support device 71. That is, the cover 161 may be relatively pressed toward the circuit accommodating recess 46 by the glass jig 73.

The support device 71, which is configured to adjust the position of the motor 10, is used so that the cover 161 uniformly abuts the circuit accommodating recess 46 over the entire periphery. Instead, the press device 74 may adjust the pressing direction of the glass jig 73. Further, the welding device 70 may have a simplified structure that does not include such an adjustment function.

The glass jig 73 is made of a glass material and serves as a transparent jig. Instead, a transparent jig made of a material such as an acrylic of which the strength and transmittance is the same as a glass material may be used.

The circuit accommodating recess 46, the cover 161, and the circuit board 56 are substantially L-shaped. Instead, the circuit accommodating recess 46, the cover 161, and the circuit board 56 may have a different shape such as the shape of a simple rectangle.

The circuit board 56 accommodated in the circuit accommodating recess 46 includes the control circuit of the motor 10. Instead, the circuit included in the circuit board may differ from the control circuit.

The motor unit 20 includes a brush motor. Instead, the motor unit may include other motors such as a brushless motor.

The output unit 40 of the motor 10 includes the reduction mechanism (worm shaft 53, worm wheel 54). However, the motor does not have to include the reduction mechanism.

The present invention is applied to the motor 10, which is used as the drive source of the power window device. Instead, the present invention may be applied to motors of other in-vehicle devices and motors of devices mounted in machines other than vehicles.

While the present disclosure is described with reference to examples, the present disclosure is not limited to the example or the configuration of the example. The present disclosure includes various variations and modifications within an equivalent range. In addition, various combinations and forms and other combinations and forms, which include only one element or more, shall be within the scope or a range of ideas of the present disclosure.

The invention claimed is:
1. A motor comprising:
a rotary shaft;
a motor unit that rotates the rotary shaft;
a circuit board that controls rotation of the rotary shaft;

a case including a circuit accommodating recess that accommodates the circuit board; and a synthetic resin cover that closes an opening of the circuit accommodating recess, wherein the cover includes an outer rib and an inner rib, the outer rib is located outward from an open end surface of the circuit accommodating recess and projected from a peripheral edge of the cover toward a side of a front surface and a side of a rear surface of the cover, and the inner rib is located inward from the open end surface and projected toward at least one of the side of the front surface of the cover or the side of the rear surface of the cover.

2. The motor according to claim 1, wherein the inner rib includes a looped portion arranged along an inner peripheral surface of an open end of the circuit accommodating recess.

3. The motor according to claim 1, wherein the case include a step on an outer peripheral surface of an open end of the circuit accommodating recess to receive the outer rib.

4. The motor according to claim 1, wherein one of the open end surface and a portion of the cover opposing the open end surface includes a projection looped along the open end of the circuit accommodating recess and having a width that is narrowed toward a distal end in a projection direction.

5. The motor according to claim 1, wherein the outer rib is identically shaped on the front surface and the rear surface of the cover.

6. The motor according to claim 1, wherein the circuit board includes a magnetic sensor that detects a magnetic field of a sensor magnet that is rotated integrally with the rotary shaft, the circuit board is located at a position that does not overlap the rotary shaft in a motor flat orthogonal direction as viewed in a rotation axis direction of the rotary shaft so that a thickness direction of the circuit board is parallel to the motor flat orthogonal direction, the magnetic sensor is configured to simultaneously detect an upright magnetic field that enters the magnetic sensor in a vertical direction and a transverse magnetic field that enters the magnetic sensor in a horizontal direction, the magnetic sensor is located outside a motor flat direction range of the rotary shaft as viewed in a direction of a rotation axis of the rotary shaft, the opening of the circuit accommodating recess is arranged in a range that does not overlap the rotary shaft as viewed in the motor flat orthogonal direction, and the cover does not overlap the rotary shaft in the motor flat orthogonal direction.

7. The motor according to claim 1, wherein the case includes a separation restricting projection that projects outward from an open end of the circuit accommodating recess, extends along the open end, and opposes a distal end surface of the outer rib, and an outer peripheral surface of the separation restricting projection is flush with an outer peripheral surface of the outer rib or located outward from the outer peripheral surface of the outer rib.

8. The motor according to claim 1, wherein the circuit accommodating recess includes a side wall, and the open end surface is a distal end surface of the side wall.

* * * * *